United States Patent
Scheuerlein

(10) Patent No.: US 8,270,199 B2
(45) Date of Patent: Sep. 18, 2012

(54) CROSS POINT NON-VOLATILE MEMORY CELL

(75) Inventor: Roy E. Scheuerlein, Cupertino, CA (US)

(73) Assignee: SanDisk 3D LLC, Milpitas, CA (US)

( * ) Notice: Subject to any disclaimer, the term of this patent is extended or adjusted under 35 U.S.C. 154(b) by 367 days.

(21) Appl. No.: 12/418,191

(22) Filed: Apr. 3, 2009

(65) Prior Publication Data

US 2010/0254175 A1    Oct. 7, 2010

(51) Int. Cl.
*G11C 11/21*    (2006.01)
(52) U.S. Cl. .................................................. 365/148
(58) Field of Classification Search ............... 365/148, 365/158, 163, 171, 173
See application file for complete search history.

(56) References Cited

U.S. PATENT DOCUMENTS

| | | | |
|---|---|---|---|
| 5,877,523 A | 3/1999 | Liang | |
| 6,034,882 A | 3/2000 | Johnson | |
| 6,420,215 B1 | 7/2002 | Knall | |
| 6,490,194 B2 * | 12/2002 | Hoenigschmid | 365/171 |
| 6,567,287 B2 | 5/2003 | Scheuerlein | |
| 6,574,138 B2 | 6/2003 | Schwarzl | |
| 6,690,597 B1 * | 2/2004 | Perlov et al. | 365/94 |
| 6,777,773 B2 | 8/2004 | Knall | |
| 6,822,903 B2 | 11/2004 | Scheuerlein | |
| 6,856,572 B2 | 2/2005 | Scheuerlein | |
| 6,879,505 B2 | 4/2005 | Scheuerlein | |
| 6,885,579 B2 | 4/2005 | Sakimura | |
| 6,952,043 B2 | 10/2005 | Vyvoda | |
| 6,984,561 B2 | 1/2006 | Herner | |
| 7,002,843 B2 | 2/2006 | Guterman | |
| 7,005,350 B2 | 2/2006 | Walker | |
| 7,022,572 B2 | 4/2006 | Scheuerlein | |
| 7,187,577 B1 | 3/2007 | Wang | |
| 7,272,035 B1 | 9/2007 | Chen | |

(Continued)

FOREIGN PATENT DOCUMENTS

EP    1306852    5/2003

(Continued)

OTHER PUBLICATIONS

Office Action dated Nov. 12, 2010, US Appl. No. 12/418,212, filed Apr. 3, 2009.

(Continued)

*Primary Examiner* — Douglas King
(74) *Attorney, Agent, or Firm* — Vierra Magen Marcus & DeNiro LLP

(57) ABSTRACT

A memory system includes an X line, a first Y line, a second Y line, a semiconductor region of a first type running along the X line, first switching material and a first semiconductor region of a second type between the first Y line and the semiconductor region of the first type, second switching material and a second semiconductor region of the second type between the second Y line and the semiconductor region of the first type, and control circuitry. The control circuitry is in communication with the X line, the first Y line and the second Y line. The control circuitry changes the programming state of the first switching material to a first state by causing a first current to flow from the second Y line to the first Y line through the first switching material, the second switching material, the semiconductor region of the first type, the first semiconductor region of the second type and the second semiconductor region of the second type.

27 Claims, 19 Drawing Sheets

U.S. PATENT DOCUMENTS

| | | | |
|---|---|---|---|
| 7,285,464 | B2 | 10/2007 | Herner |
| 7,327,601 | B2 | 2/2008 | Rinerson |
| 7,369,431 | B2 | 5/2008 | Muraoka |
| 2002/0038883 | A1 | 4/2002 | Lowrey |
| 2006/0073657 | A1 | 4/2006 | Herner |
| 2006/0246606 | A1 | 11/2006 | Hsu |
| 2006/0250836 | A1 | 11/2006 | Herner |
| 2007/0090425 | A1 | 4/2007 | Kumar |
| 2008/0025066 | A1 | 1/2008 | Fasoli |
| 2008/0123393 | A1 | 5/2008 | Kinoshita |
| 2009/0027953 | A1 | 1/2009 | Kang |
| 2009/0034322 | A1 | 2/2009 | Hung |
| 2009/0309089 | A1 | 12/2009 | Hsia |
| 2010/0102291 | A1 | 4/2010 | Xu |
| 2010/0155784 | A1 | 6/2010 | Scheuerlein |
| 2010/0254175 | A1 | 10/2010 | Scheuerlein |
| 2010/0254176 | A1 | 10/2010 | Scheuerlein |
| 2010/0259976 | A1 | 10/2010 | Abedifard |

FOREIGN PATENT DOCUMENTS

| | | |
|---|---|---|
| WO | WO2005059921 | 6/2005 |

OTHER PUBLICATIONS

Response to Office Action dated Dec. 2, 2010, US Appl. No. 12/418,212, filed Apr. 3, 2009.
U.S. Appl. No. 12/418,212, filed Apr. 3, 2009, titled "Multi-Bit Resistance-Switching Memory Cell,".
U.S. Appl. No. 12/418,233, filed Apr. 3, 2009, titled "Programming Non-Volatile Storage Element Using Current From Other Element,".
U.S. Appl. No. 12/139,435, filed Jun. 13, 2008, titled "Non-Volatile Memory Arrays Comprising Rail Stacks With a Shared Diode Component Portion for Diodes of Electrically Isolated Pillars".
U.S. Appl. No. 12/344,022, filed 12/24/08, titled "Three-Dimensional Memory Structures Having Shared Pillar Memory Cells".
Notice of Allowance dated Apr. 1, 2011, U.S. Appl. No. 12/418,233.
Response to Office Action dated Apr. 28, 2011, U.S. Appl. No. 12/418,212, filed Apr. 3, 2009.
Office Action dated Jul. 12, 2011, U.S. Appl. No. 12/418,212, filed Apr. 3, 2009.
International Search Report dated Aug. 20, 2010, PCT Patent Application No. PCT/US2010/029186.
Written Opinion of the International Searching Authority dated Aug. 20, 2010, PCT Patent Application No. PCT/U52010/029186.
International Search Report dated Aug. 23, 2010, PCT Patent Application No. PCT/US2010/029189.
Written Opinion of the International Searching Authority dated Aug. 23, 2010, PCT Patent Application No. PCT/US2010/029189.
International Search Report dated Aug. 23, 2010, PCT Patent Application No. PCT/US2010/029192.
Written Opinion of the International Searching Authority dated Aug. 23, 2010, PCT Patent Application No. PCT/US2010/029192.
Response to Office Action dated Oct. 26, 2011, U.S. Appl. No. 12/418,212, filed Apr. 3, 2009.
Office Action dated Jan. 24, 2011, U.S. Appl. No. 12/418,212, filed Apr. 3, 2009.
Notice of Allowance dated Nov. 16, 2011, U.S. Appl. No. 12/418,212, filed Apr. 3, 2009.
Office Action dated Mar. 27, 2012, U.S. Appl. No. 13/154,832, filed Jun. 7, 2011.
Response to Office Action dated Jun. 12, 2012, U.S. Appl. No. 13/154,832, filed Jun. 7, 2011.
European Response to Written Opinion dated May 29, 2012, European Patent Application No. 10725309.8.
European Response to Written Opinion dated May 28, 2012, European Patent Application No. 10726350.1.
European Response to Written Opinion dated May 29, 2012, European Patent Application No. 10726351.9.
Notice of Allowance dated Jun. 27, 2012, U.S. Appl. No. 13/154,832, filed Jun. 7, 2011.

* cited by examiner

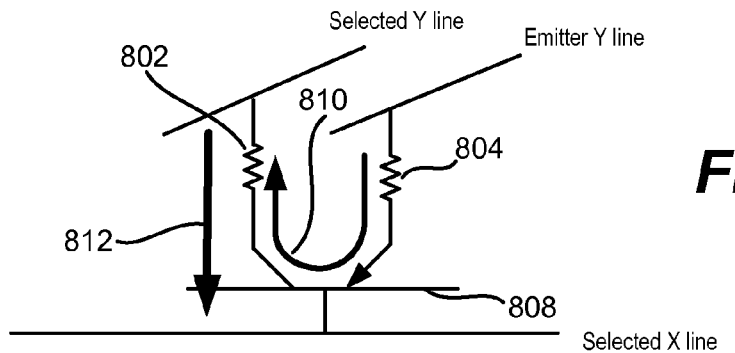
*Fig. 13*
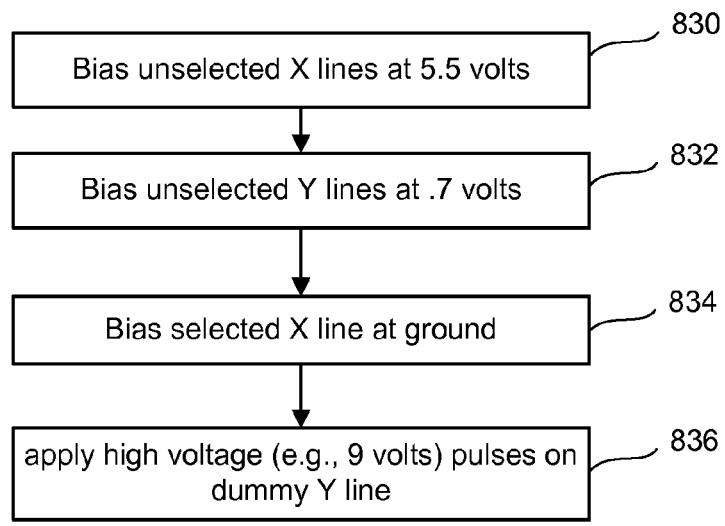
*Fig. 14*
*Fig. 15*
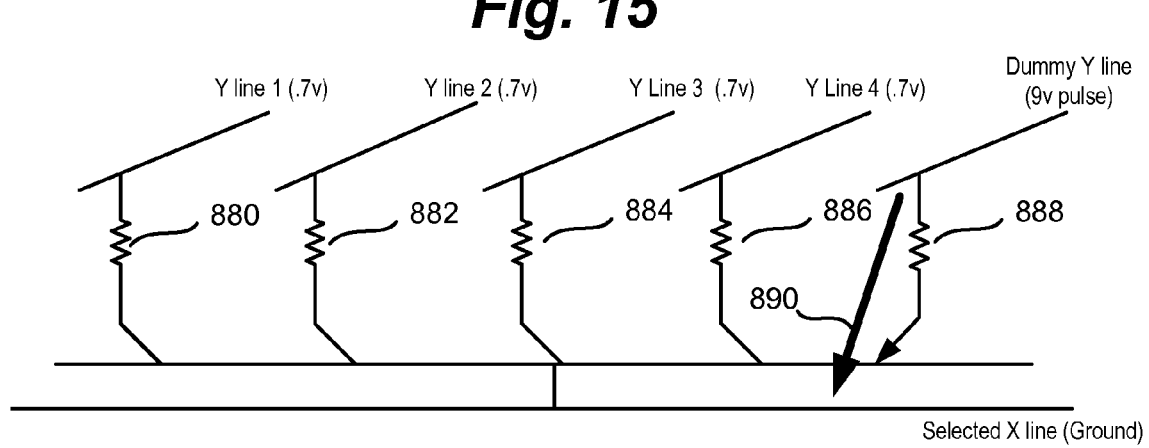

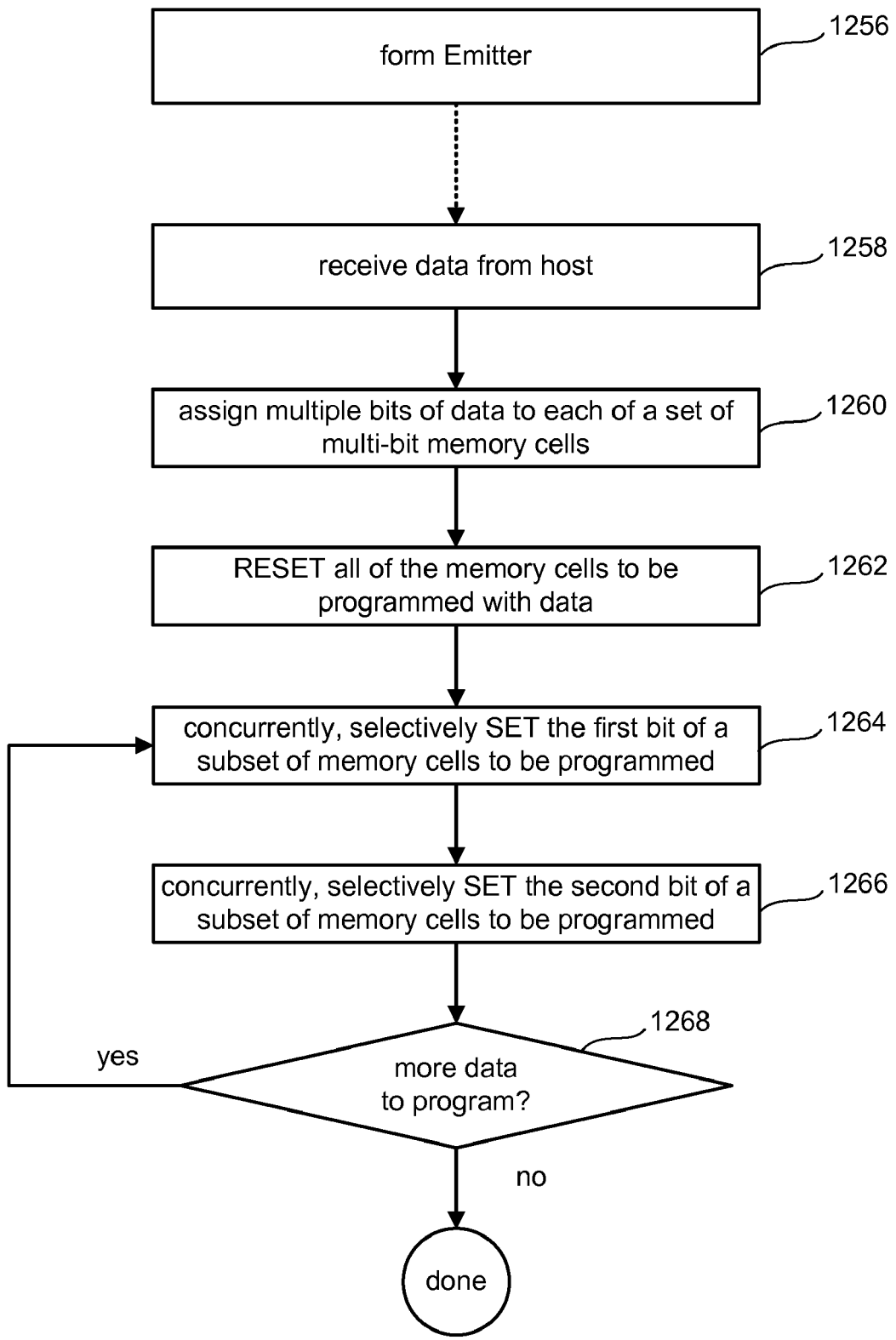

*Fig. 31*
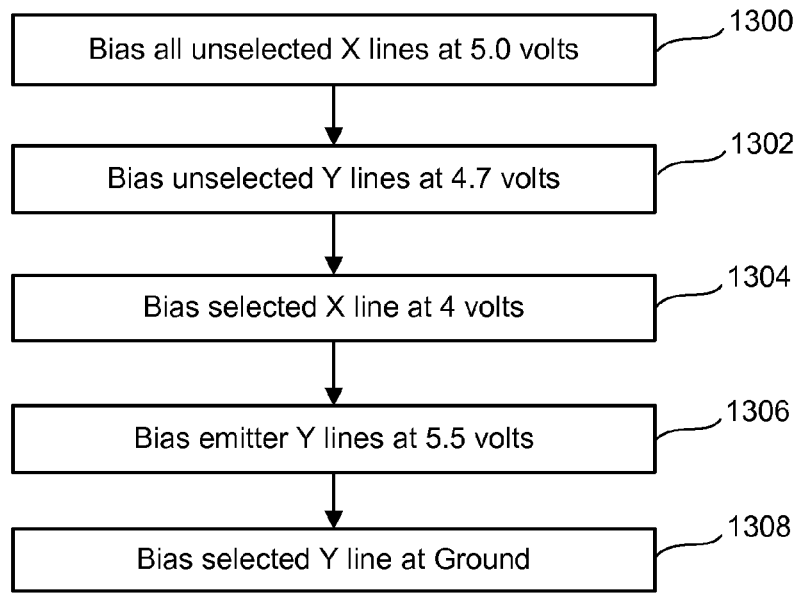
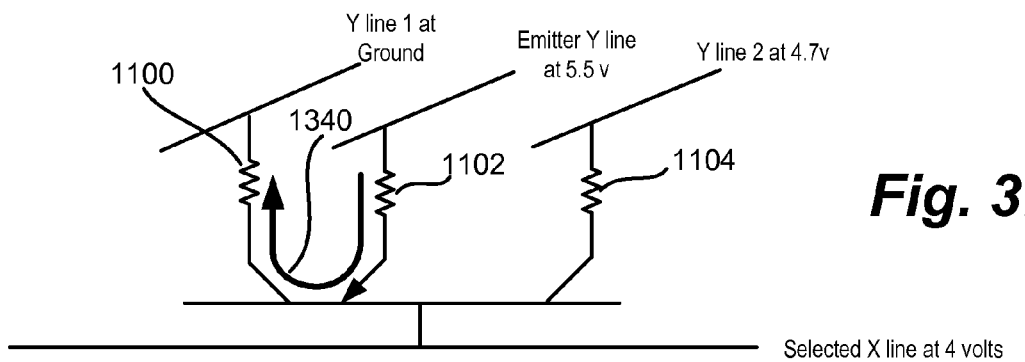
*Fig. 32A*
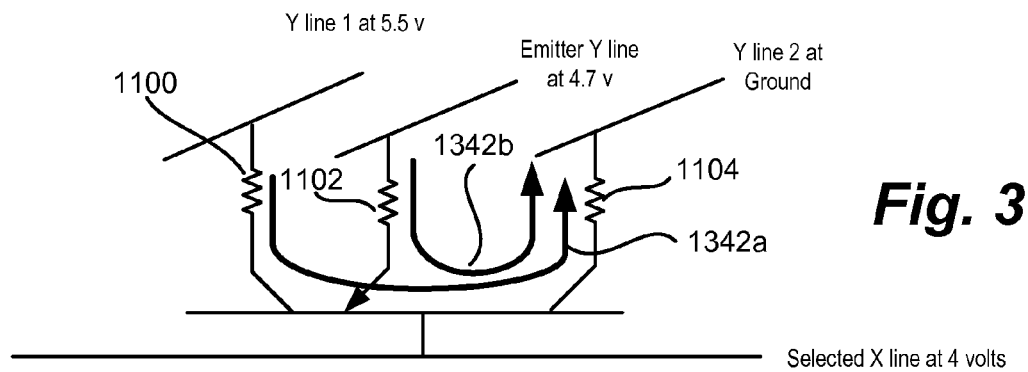
*Fig. 32B*

CROSS POINT NON-VOLATILE MEMORY CELL

BACKGROUND

1. Field

The present invention relates to technology for data storage.

2. Description of the Related Art

A variety of materials show reversible resistance-switching behavior. These materials include chalcogenides, carbon polymers, graphitic carbon, carbon nano tubes, perovskites, and certain metal oxides and nitrides. Specifically, there are metal oxides and nitrides which include only one metal and exhibit reliable resistance switching behavior. This group includes, for example, NiO, $Nb_2O_5$, $TiO_2$, $HfO_2$, $Al_2O_3$, $MgO_x$, $CrO_2$, VO, BN, and AlN, as described by Pagnia and Sotnick in "Bistable Switching in Electroformed Metal-Insulator-Metal Device," Phys. Stat. Sol. (A) 108, 11-65 (1988). A layer of one of these materials may be formed in an initial state, for example a relatively low-resistance state. Upon application of sufficient voltage, the material switches to a stable high-resistance state. This resistance switching is reversible such that subsequent application of an appropriate current or voltage can serve to return the resistance-switching material to a stable low-resistance state. This conversion can be repeated many times. For some materials, the initial state is high-resistance rather than low-resistance.

These reversible resistance-switching materials are of interest for use in nonvolatile memory arrays. One resistance state may correspond to a data "0," for example, while the other resistance state corresponds to a data "1." Some of these materials may have more than two stable resistance states.

Non-volatile memories formed from reversible resistance-switching elements are known. For example, U.S. Patent Application Publication 2006/0250836, filed May 9, 2005 and titled "REWRITEABLE MEMORY CELL COMPRISING A DIODE AND A RESISTANCE-SWITCHING MATERIAL," which is hereby incorporated by reference herein in its entirety, describes a rewriteable non-volatile memory cell that includes a diode coupled in series with a reversible resistance-switching material such as a metal oxide or metal nitride.

However, operating memory devices that employ reversible resistance-switching materials is difficult.

SUMMARY

A storage system is described that uses reversible resistance-switching elements. Various circuits and methods are disclosed for controlling the reading, setting and resetting of the resistance for the reversible resistance-switching elements.

One embodiment includes a method of programming a first storage element of an integrated circuit memory system. The memory system includes the first storage element and a second storage element. The first storage element is connected between a first Y line and an X line. The second storage element is connected between a second Y line and the X line. The method comprises passing a first current between the first Y line and the second Y line to cause the first storage element to change state to a first state.

One embodiment of a non-volatile storage apparatus includes an X line; a first Y line; a second Y line; a semiconductor region of a first type running along the X line; first switching material and a first semiconductor region of a second type between the first Y line and the semiconductor region of the first type; second switching material and a second semiconductor region of the second type between the second Y line and the semiconductor region of the first type; and control circuitry in communication with the X line, the first Y line and the second Y line. The first semiconductor region of the second type is adjacent to the semiconductor region of the first type. The second semiconductor region of the second type is adjacent to the semiconductor region of the first type. The control circuitry changes the programming state of the first switching material to a first state by causing a first current to flow from the second Y line to the first Y line through the first switching material and the second switching material.

One embodiment of a non-volatile storage apparatus includes a plurality of X line rails, a plurality of Y line rails, semiconductor regions of a first type shaped as rails and adjacent the X line rails, pillars between the Y line rails and the X line rails, and control circuitry in communication with the X line rails and the Y line rails. The pillars include a resistive switching material and a semiconductor region of a second type. The semiconductor region of the second type is positioned adjacent to the semiconductor regions of the first type that are shaped as rails. The pillars include a first pillar and a second pillar. The first pillar is positioned between a first Y line rail and a first X line rail. The second pillar is positioned between a second Y line rail and the first X line rail. The first pillar and the second pillar are adjacent a common semiconductor region of the first type. The control circuitry changes the programming state of the first pillar by causing a first current to flow from the second Y line rail to the first Y line rail through the common semiconductor region of the first type, the first pillar and the second pillar.

One embodiment includes a method of programming a first storage element of a memory system. The memory system includes the first storage element and a second storage element. The first storage element is connected between a first Y line and an X line. The second storage element is connected between a second Y line and the X line. The first storage element and the second storage element share a common semiconductor region that runs along the X line. The first storage element includes a first semiconductor region adjacent a first portion of the common semiconductor region. The second storage element includes a second semiconductor region adjacent a second portion of the common semiconductor region. The method comprises biasing the X line to allow current between the second semiconductor region and the first semiconductor region through the common semiconductor region, biasing the first Y line to a low voltage level, and biasing the second Y line to a higher voltage level to cause a current from the second Y line to the first Y line through the second semiconductor region, the common semiconductor region and the first semiconductor region to cause the first storage element to change state to a first state.

One embodiment includes a method of programming a first storage element of a memory system. The memory system includes the first storage element and a second storage element. The first storage element is connected to a selected control line of the first type of control lines and a selected control line of a second type of control lines. The second storage element is connected to the selected control line of the first type of control lines and a different control line of the second type of control lines. The first storage element and the second storage element share a common semiconductor region. The method comprises biasing unselected control lines of the first type of control lines to a first voltage level, biasing the selected control line of the first type of control lines to a second voltage level, biasing unselected control lines of the second type of control lines to a third voltage level, biasing the selected control line of the second type of control lines to a fourth voltage level, and biasing the different control line of the second type of control lines to a fifth voltage level. The second voltage level is lower than the first voltage level. The third voltage level is lower than the first voltage level. The fourth voltage level is lower than the second voltage level. The fifth voltage level is higher than the fourth voltage level. The current from the different control line changes the state of the first storage element to a first state.

BRIEF DESCRIPTION OF THE DRAWINGS

FIG. 13 is a schematic diagram of a portion of one embodiment of a memory array.

FIG. 14 is a flow chart describing one embodiment of a process for performing a Forming operation.

FIG. 15 is a schematic diagram of a portion of one embodiment of a memory array during one embodiment of a Forming operation.

FIG. 28 is a flow chart describing one embodiment of a process for operating a memory array.

FIG. 31 is a flow chart describing one embodiment of a process for performing a SET operation.

FIG. 32A is a schematic diagram of a portion of one embodiment of a memory array during one embodiment of a SET operation.

FIG. 32B is a schematic diagram of a portion of one embodiment of a memory array during one embodiment of a SET operation.

DETAILED DESCRIPTION

A memory system is provided that includes memory cells with one or more reversible resistivity-switching elements. Various circuits and methods are disclosed for controlling the setting and resetting of the resistance for the reversible resistance-switching elements.

Memory Cell and System

Figure 1:
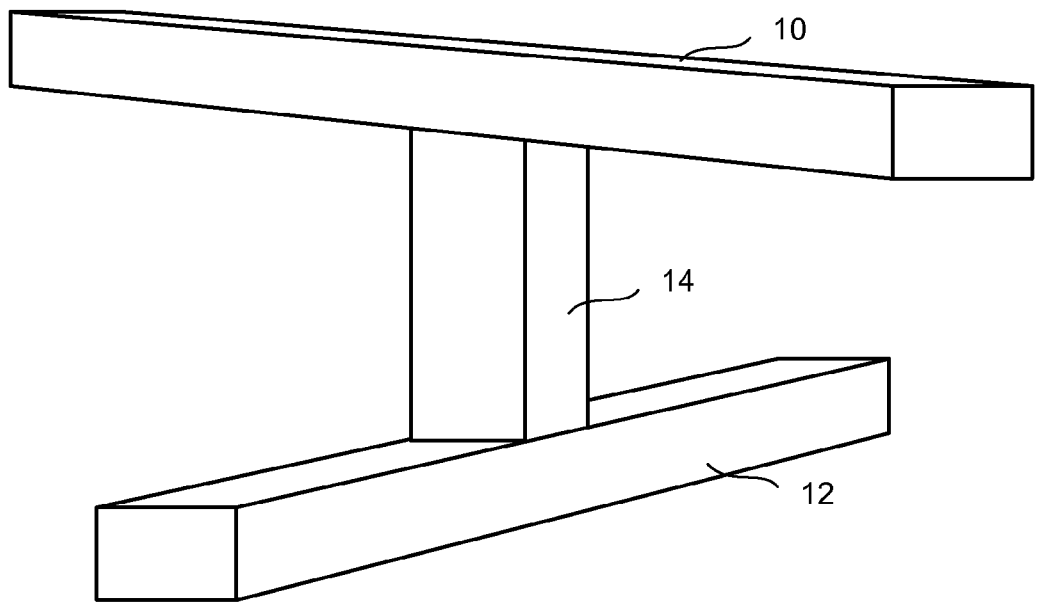
FIG. 1 is a simplified prospective view of one embodiment of a memory cell with a reversible resistance-switching element.

FIG. 1 is a simplified perspective view of one embodiment of a memory cell 14, which includes one reversible resistance-switching element coupled in series with a steering element, between a first conductor 10 and a second conductor 12. The steering element can take the form of any suitable device exhibiting a nonlinear conduction current characteristic, such as a diode.

The reversible resistance-switching element includes reversible resistivity-switching material having a resistivity that may be reversibly switched between two or more states. For example, the reversible resistivity-switching material may be in an initial high-resistivity state upon fabrication that is switchable to a low-resistivity state upon application of a first voltage and/or current. Application of a second voltage and/or current may return the reversible resistivity-switching material to the high-resistivity state. Alternatively, the reversible resistance-switching element may be in an initial low-resistance state upon fabrication that is reversibly switchable to a high-resistance state upon application of the appropriate voltage(s) and/or current(s). When used in a memory cell, one resistance state may represent a binary "0" while another resistance state may represent a binary "1." However, more than two data/resistance states may be used. Numerous reversible resistivity-switching materials and operation of memory cells employing reversible resistance-switching materials are described, for example, in U.S. Patent Application Publication 2006/0250836, incorporated herein by reference.

In one embodiment, the process of switching the resistance from the high-resistivity state to the low-resistivity state is referred to as a SET operation. The process of switching the resistance from the low-resistivity state to the high-resistivity state is referred to as a RESET operation. In one embodiment, the high-resistivity state is associated with binary data "0" and the low-resistivity state is associated with binary data "1." In other embodiments, SETTING and RESETTING and/or the data encoding can be reversed.

In some embodiments, the reversible resistance-switching material may be formed from a metal oxide. Various different metal oxides can be used. In one example, nickel oxide is be used.

In at least one embodiment, through use of a selective deposition process, a nickel oxide layer may be used in a reversible resistance-switching material without the nickel oxide layer being etched. For example, a reversible resistance-switching element may be formed by employing a deposition process such as electroplating, electroless deposition, or the like, to selectively deposit a nickel-containing layer only on conductive surfaces formed above a substrate. In this manner, only the conductive surfaces on the substrate are patterned and/or etched (prior to deposition of the nickel-containing layer) and not the nickel-containing layer.

In at least one embodiment, the reversible resistance-switching material includes at least a portion of a nickel oxide layer formed by selectively depositing nickel and then oxidizing the nickel layer. For example, Ni, $Ni_xP_y$ or another similar form of nickel may be selectively deposited using electroless deposition, electroplating or a similar selective process, and then oxidized to form nickel oxide (e.g., using rapid thermal oxidation or another oxidation process). In other embodiments, nickel oxide itself may be selectively deposited. For example, an NiO—, $NiO_x$— or $NiO_xP_y$-containing layer may be selectively deposited above the steering element using a selective deposition process and then annealed and/or oxidized (if necessary).

Other materials may be selectively deposited, and then annealed and/or oxidized if necessary, in accordance with the present invention to form reversible resistivity-switching materials for use in memory cells. For example, a layer of Nb, Ta, V, Al, Ti, Co, cobalt-nickel alloy, etc., may be selectively deposited, such as by electroplating, and oxidized to form a reversible resistivity-switching material.

More information about fabricating a memory cell using reversible resistance-switching material can be found in U.S. patent application Ser. No. 11/772,084, "Memory Cell That Employs A Selectively Deposited Reversible Resistance Switching Element and Methods of Forming The Same," filed on Jun. 29, 2007, published as U.S. Patent App. 2009/0001343, incorporated herein by reference in its entirety.

Conductors 10 and 12 are typically orthogonal to one another and form array terminal lines for accessing an array of memory cells. The array terminal lines (also called array lines) at one layer may be termed X lines. The array terminal lines at a vertically adjacent layer may be termed Y lines. A memory cell can be formed at the projected intersection of each X line and each Y line, and connected between the respective intersecting X line and Y line. The terms "X line" and "Y line" are arbitrary labels and other terms can also be used. In one embodiment, X lines will serve as word lines and Y lines will serve as bit lines. In another embodiment X lines will serve as bit lines and Y lines will serve as word lines. In other embodiments, X lines and Y lines will be used differently. In one example, conductor 10 of FIG. 1 is a Y line and conductor 12 is an X line.

Conductors 10 and 12 include any suitable conductive material such as tungsten, any appropriate metal, heavily doped semiconductor material, a conductive silicide, a conductive silicide-germanide, a conductive germanide, or the like. In the embodiment of FIG. 1, conductors 10 and 12 are rail-shaped and extend in different directions (e.g., in substantially perpendicular directions). Other conductor shapes and/or configurations may be used. In some embodiments, barrier layers, adhesion layers, antireflection coatings and/or the like (not shown) may be used with conductors 10 and 12 to improve device performance and/or aid in device fabrication.

Figure 2:
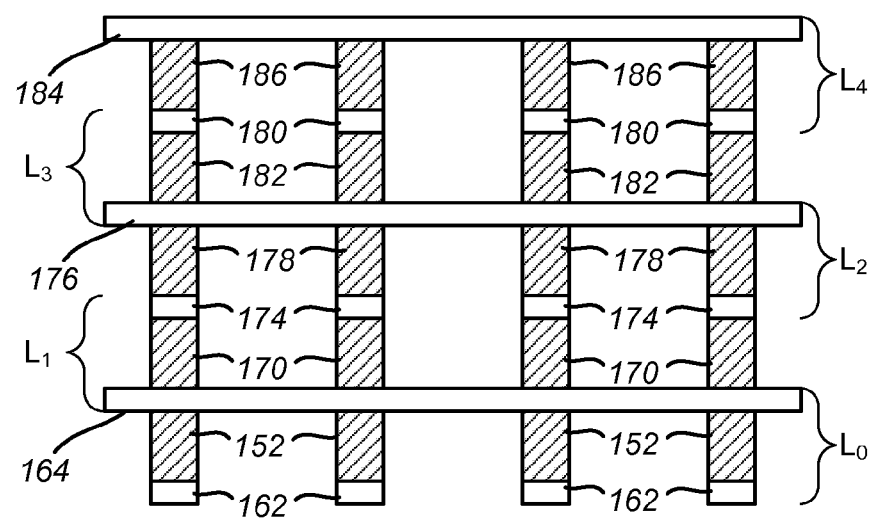
FIG. 2 is a simplified side view of a portion of a three dimensional memory array formed from a plurality of the memory cells of FIG. 1.

FIG. 2 is a side cutaway view of a portion of an exemplary monolithic three-dimensional memory array that can be used in one embodiment. However, other memory structures can be used in accordance with various embodiments, including two-dimensional memory structures manufactured on, above, or within a semiconductor substrate. Both the X line and Y line layers are shared between memory cells in vertically adjacent layers the structure depicted in FIG. 2. This configuration is often referred to as a fully mirrored structure. A plurality of substantially parallel and coplanar conductors form a first set of Y lines 162 at a first memory level L0. Memory cells 152 at level L0 are formed between these Y lines and adjacent X lines 164. In the arrangement of FIG. 2, X lines 164 are shared between memory layers L0 and L1 and thus, further connect to memory cells 170 at memory level L1. A third set of conductors form Y lines 174 for these cells at level L1. These Y lines 174 are in turn shared between memory levels L1 and memory level L2. Memory cells 178 are connected to Y lines 174 and X lines 176 to form the third memory level L2. Memory cells 182 are connected to X lines 176 and Y lines 180 to form the fourth memory level L3. Memory cells 186 are connected to Y lines 180 and X lines 184 to form the fifth memory level L4. The arrangement of the steering element's (e.g., diodes') polarity and the respective arrangement of the X lines and Y lines can vary by embodiment. Additionally, more or less than five memory levels can be used.

If p-i-n diodes are used as steering elements for the memory cells in the embodiment of FIG. 2, the diodes of memory cells 170 can be formed upside down relative to the p-i-n diodes of the first level of memory cells 152. For example, if cells 152 include a bottom heavily doped region that is n-type and a top heavily doped region that is p-type, then in the second level of cells 170, the bottom heavily doped region may be p-type while the top heavily doped region is n-type.

In an alternative embodiment, an inter-level dielectric can be formed between adjacent memory levels and no conductors are shared between memory levels. This type of structure for three-dimensional monolithic storage memory is often referred to as a non-mirrored structure. In some embodiments, adjacent memory levels that share conductors and adjacent memory levels that do not share conductors can be stacked in the same monolithic three dimensional memory array. In other embodiments, some conductors are shared while others are not. For example, only the X lines or only the Y lines can be shared in some configurations. This type of configuration is often referred to as half-mirrored. Memory levels need not all be formed having the same type of memory cell. If desired, memory levels using resistive change materials can alternate with memory levels using other types of memory cells, etc.

In one embodiment as described in U.S. Pat. No. 7,054,219, entitled, "Transistor Layout Configuration for Tight Pitched Memory Array Lines," word lines are formed using word line segments disposed on different word line layers of the array. The segments can be connected by a vertical connection to form an individual word line. A group of word lines, each residing on a separate layer and substantially vertically-aligned (notwithstanding small lateral offsets on some layers), may be collectively termed a row. The word lines within a row preferably share at least a portion of the row address. Similarly, a group of bit lines, each residing on a separate layer and substantially vertically-aligned (again, notwithstanding small lateral offsets on some layers), may be collectively termed a column. The bit lines within a column preferably share at least a portion of the column address.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three Dimensional Structure Memory." The substrates may be thinned or removed from the memory levels before bonding, but as the memory levels are initially formed over separate substrates, such memories are not true monolithic three dimensional memory arrays.

FIGS. 1 and 2 show memory cells in a pillar shape and conductors in the shape of rails. However, the technology described herein is not limited to any one specific structure or shape for a memory cell. Other structures can also be used to form memory cells that include reversible resistivity-switching material. For example, the following patents provide examples of structures of memory cells that can be adapted to use reversible resistivity-switching material: U.S. Pat. Nos. 6,952,043; 6,951,780; 6,034,882; 6,420,215; 6,525,953; and 7,081,377.

Figure 3:
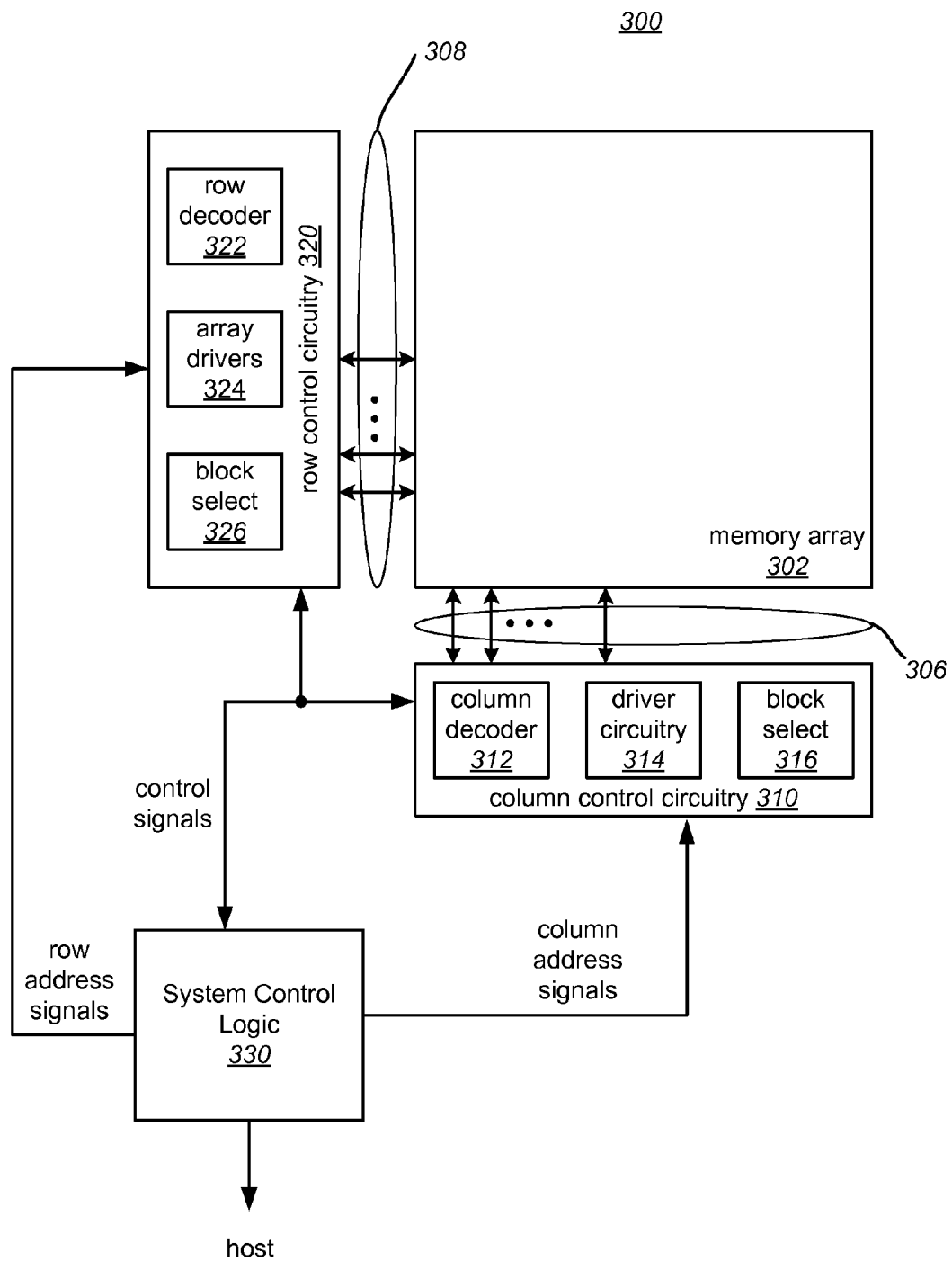
FIG. 3 is a block diagram of one embodiment of a memory system that can be formed on one or more integrated circuits.

FIG. 3 is a block diagram that depicts one example of a memory system 300 that can implement the technology described herein. Memory system 300 includes a memory array 302 that can be a two or three dimensional array of memory cells as described above. In one embodiment, memory array 302 is a monolithic three dimensional memory array implemented on one or more integrated circuits. The array terminal lines of memory array 302 include the various layer(s) of word lines organized as rows, and the various layer(s) of bit lines organized as columns. However, other orientations can also be implemented.

Memory system 300 includes row control circuitry 320, whose outputs 308 are connected to respective word lines of the memory array 302. Row control circuitry 320 receives a group of M row address signals and one or more various control signals from System Control Logic circuit 330, and typically may include such circuits as row decoders 322, array terminal drivers 324, and block select circuitry 326 for both reading and programming (e.g., SET and RESET) operations. Memory system 300 also includes column control circuitry 310 whose input/outputs 306 are connected to respective bit lines of the memory array 302. Column control circuitry 306 receives a group of N column address signals and one or more various control signals from System Control Logic 330, and typically may include such circuits as column decoders 312, array terminal receivers or drivers 314, block select circuitry 316, as well as read/write circuitry, and I/O multiplexers. System control logic 330 receives data and commands from a host system (e.g., computer, PDA, telephone, camera, etc.) and provides output data to the host. In other embodiments, system control logic 330 receives data and commands from a separate controller circuit and provides output data to that controller circuit, with the controller circuit communicating with the host. System control logic 330 may include one or more state machines, registers and other control logic for controlling the operation of memory system 300.

In one embodiment, all of the components depicted in FIG. 3 are arranged on a single integrated circuit. For example, system control logic 330, column control circuitry 310 and row control circuitry 320 are formed on the surface of a substrate and memory array 302 is a monolithic three dimensional memory array formed above the substrate (and, therefore, above system control logic 330, column control circuitry 310 and row control circuitry 320). In some cases, a portion of the control circuitry can be formed on the same layers as some of the memory array. In some embodiments, the memory is made using one or more semiconductors.

Integrated circuits incorporating a memory array usually subdivide the array into a number of sub-arrays or blocks. Blocks can be further grouped together into bays that contain, for example, 16, 32, or a different number of blocks. As frequently used, a sub-array is a contiguous group of memory cells having contiguous word and bit lines generally unbroken by decoders, drivers, sense amplifiers, and input/output circuits. This is done for any of a variety of reasons. For example, the signal delays traversing down word lines and bit lines which arise from the resistance and the capacitance of such lines (i.e., the RC delays) may be very significant in a large array. These RC delays may be reduced by subdividing a larger array into a group of smaller sub-arrays so that the length of each word line and/or each bit line is reduced. As another example, the power associated with accessing a group of memory cells may dictate an upper limit to the number of memory cells which may be accessed simultaneously during a given memory cycle. Consequently, a large memory array is frequently subdivided into smaller sub-arrays to decrease the number of memory cells which are simultaneously accessed. Nonetheless, for ease of description, an array may also be used synonymously with sub-array to refer to a contiguous group of memory cells having contiguous word and bit lines generally unbroken by decoders, drivers, sense amplifiers, and input/output circuits. An integrated circuit may include one or more than one memory array.

Structure

Figure 4:
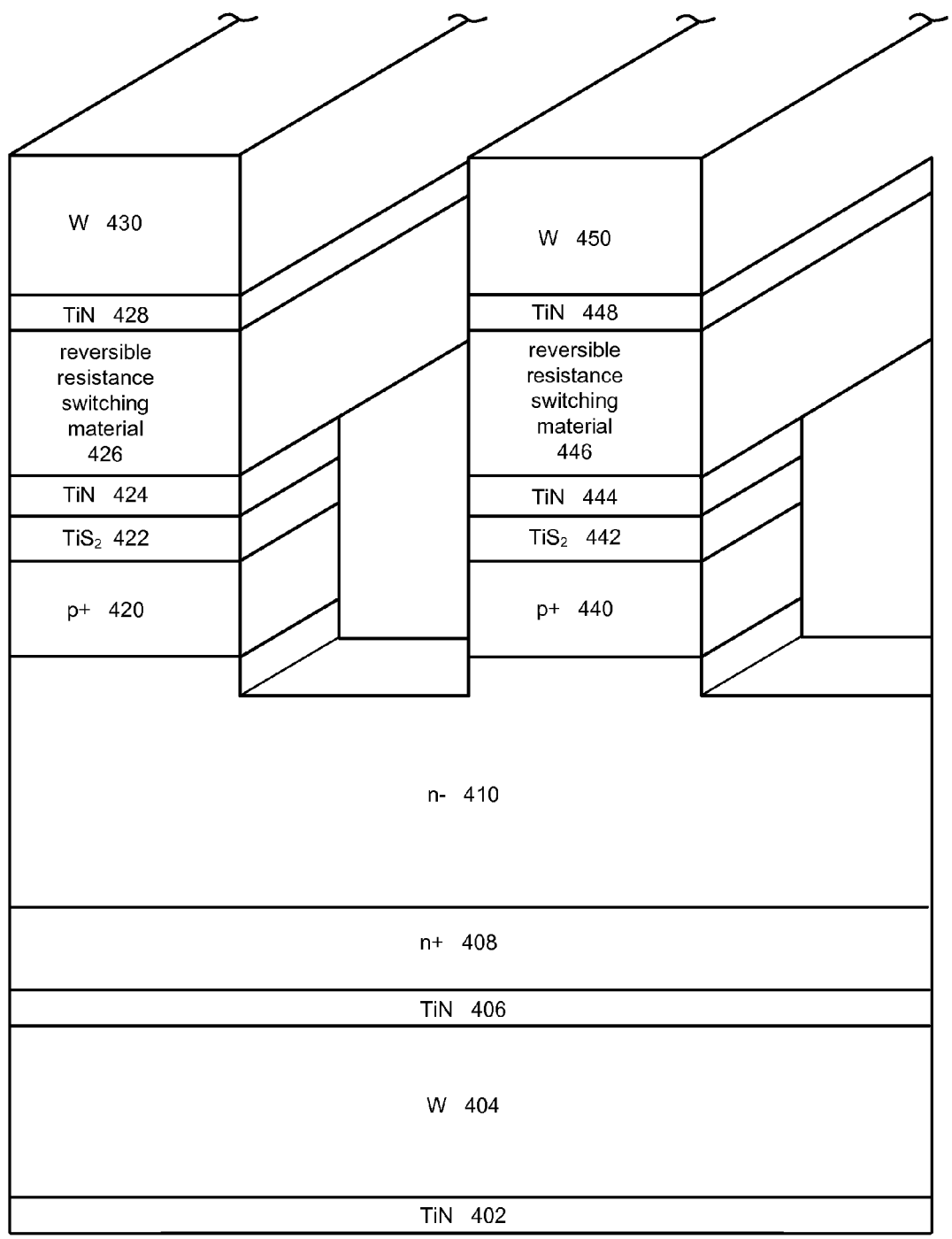
FIG. 4 is a perspective view of a portion of a three dimensional memory array.

FIG. 4 is a side cut-away view of a portion of a three dimensional monolithic memory array, showing two adjacent memory cells. For purposes of this document, adjacent means lying near, close or contiguous. For example, it is possible that there could be an intervening layer of material between two adjacent memory cells. In the embodiment of FIG. 4, the two adjacent memory cells are connected to different Y lines but the same X line. Note that FIG. 4 only shows one level of the three dimensional monolithic memory array.

The first layer depicted in FIG. 4 is electrode 402. In one embodiment, electrode 402 comprises Titanium Nitride (TiN). Above the electrode 402 is conductor 404. In one embodiment, conductor 404 comprises Tungsten (W). In other embodiments, other metals can be used. In one example, conductor 404 corresponds to conductor 12 of FIG. 1 and can be labeled as an X line. Above conductor 404 is electrode 406. In one embodiment, electrode 406 comprises TiN. Above electrode 406 is n+ layer 408. Above n+ layer 408 is n− layer 410. In one embodiment, n+ layer 408 and n− layer 410 are silicon. In other embodiments, other semiconductors can be used. Electrode 402, conductor 404, electrode 406, and silicon layers 408 and 410 are formed in the shape of a rail that runs left to right on the page depicting FIG. 4. This rail connects to many memory cells.

FIG. 4 shows two adjacent memory cells. For a first memory cell, above n– layer 410 is p+ layer 420. In one embodiment, p+ layer 420 is silicon; however, in other embodiments other semiconductors can also be used. Above p+ layer 420 is Titanium Disilicide (TiSi$_2$) layer 422. Above TiSi$_2$ layer 422 is electrode 424. In one embodiment, electrode 424 comprises TiN. In this embodiment, p+ layer 420, TiSi$_2$ layer 422 and electrode 424 are pillar shaped. Above electrode 424 is reversible resistance-switching material 426. Any of the reversible resistance-switching materials discussed above can be used. Above reversible resistance-switching material 426 is electrode 428. In one embodiment, electrode 428 comprises TiN. Above TiN 428 is conductor 430. In one embodiment, conductor 430 is made of Tungsten (W). In this embodiment, reversible resistance-switching material 426, electrode 428 and conductor 430 are formed as a rail. In the orientation depicted in FIG. 4, the rail of layers 426-430 goes in and out of the page while the rail of layers 402-410 extends left to right.

The second memory cell depicted in FIG. 4 includes a p+ layer 440 above n– layer 410. Above p+ layer 440 is a TiSi$_2$ layer 442. Above TiSi$_2$ layer 442 is electrode 444. In one embodiment, electrode 444 comprises TiN. Layers 440-444 are pillar shaped, as described above.

Reversible resistance-switching material 446 is above electrode 444. Above reversible resistance-switching material 446 is electrode 448 (e.g. TiN). Above electrode 448 is conductor 450, which in one embodiment is made of Tungsten. In one example, conductor 404 is an X line and conductors 430 and 450 are Y lines. For example, conductor 404 corresponds to conductor 12 of FIG. 1 and conductor 430 corresponds to conductor 10 of FIG. 1.

As discussed above, FIG. 4 only shows one layer of a three dimensional monolithic memory array. That memory array would include several layers, each layer being of the structure of FIG. 4. Additionally, each Y lines will connect to multiple reversible resistance-switching materials in a first direction (Y direction). The X lines will connect to multiple reversible resistance-switching materials along a second direction (e.g. the X direction). For purposes of this document, the conductors are considered to be connected to the reversible resistance-switching material even though there may be one or more intervening layers of other materials.

In one embodiment, the pillar layer of FIG. 4 is double etched so that it is self-aligned with the device rail below and the rail above. The Tungsten conductor line 404 can be formed using a damascene process or it can be an etched line. The electrodes 402 and 406 will be formed with Tungsten layer 404. The device rail (comprising n+ silicon layer 408 and n– silicon layer 410) would be a second etching process (after etching layers 402-406). When performing a second etch for the device rail (layers 408-410), layers 420-424 and 440-444 are also etched along the same direction so that these layers initially form a rail similar in geometry to layers 408 and 410. When forming conductor 430, electrode 428 and reversible resistance-switching material 426, a second mask is used and a third etching process is performed. The third etching process etches layers 430, 428, 426, 424, 422, 420 and a small portion of n-silicon layer 410. This third etching layer forms the rail that comprises layers 426-430 and etches layers 420-424 in an orthogonal direction to the second etch thereby forming layers 420-424 into a pillar. Thus, the second etch includes layers 408-424 and the third etch includes layers 420-430 (with a little portion of layer 410). As such, layers 420-424 are double etched. By extending the double etching below p+ layer 420 (and p+ layer 440), punch through can be suppressed between adjacent pillars.

Figure 5:
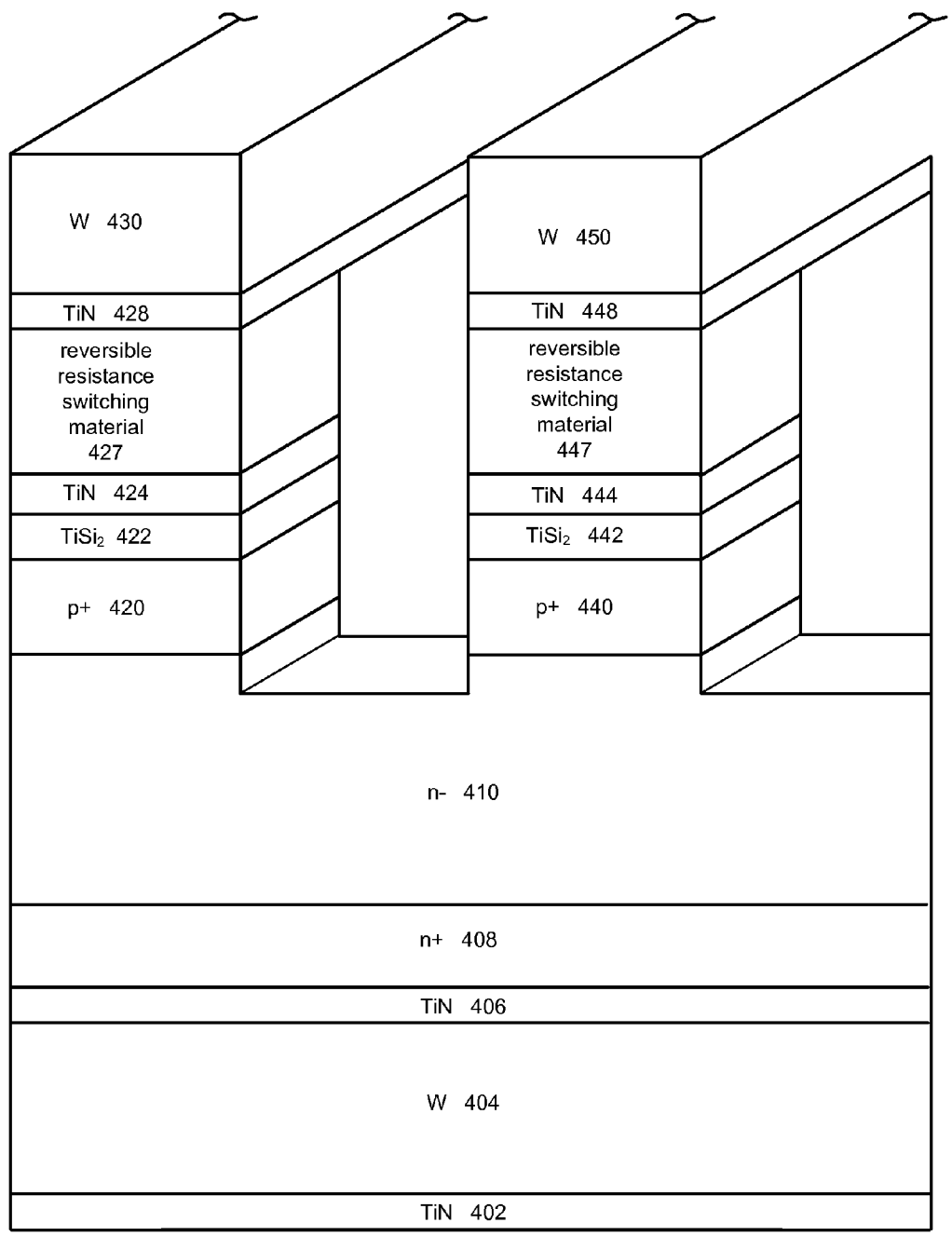
FIG. 5 is a perspective view of a portion of a three dimensional memory array.
Figure 6:
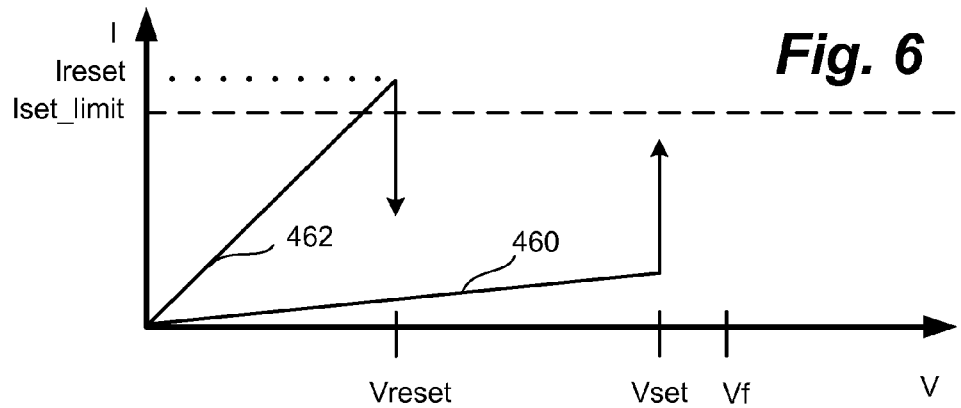
FIG. 6 is a graph depicting I-V characteristics of a reversible resistance-switching element.

FIG. 5 depicts another embodiment of a structure for implementing suitable memory cells for the technology described herein. The structure of FIG. 5 is very similar to the structure of FIG. 4. One difference between the structures of FIG. 4 and FIG. 6 is that in the structure of FIG. 4 the reversible resistance-switching material 426 (and reversible resistance-switching material 446) is part of the rail that includes conductor 430. In the embodiment of FIG. 5, the reversible resistance-switching material 427 is part of the pillar that includes layers 420-424. Similarly, reversible resistance-switching material 447 is part of the pillar that includes layers 440-444. Other variations of the above-described structures, and other structures, can be used with the technology described herein.

Note that in the embodiments of FIGS. 4 and 5, the p materials and the n materials can be reversed so that p materials are on the rail and n materials are in the pillars. Thus, instead of having a PNP structure (p+ 420, n– 410, p+ 440), the device can have a NPN structure. Thus Similarly, based on whether a PNP or NPN structure is used, currents identified herein can be electron currents or hole currents.

Reading

As described above, a reversible resistance-switching element may be reversibly switched between two or more states. For example, the reversible resistivity-switching material may be in an initial, high-resistivity state upon fabrication that is switchable to a low-resistivity state upon application of a first voltage and/or current. Application of a second voltage and/or current may return the reversible resistivity-switching material to a high-resistivity state. FIG. 6 is a graph of voltage versus current for one example embodiment of a metal oxide reversible resistance-switching element. Line 460 represents the I-V characteristics of the reversible resistance-switching element when in the high resistance state ($R_{OFF}$). Line 462 represents the I-V characteristics of the reversible resistance-switching element when in the low resistance state (RON). Vset is the voltage need to SET the reversible resistance-switching element to the low resistance state. Vreset is the voltage need to RESET the reversible resistance-switching element to the high resistance state.

While in the high-resistivity state (see line 460), if the voltage VSET and sufficient current is applied, the reversible resistance-switching element will be SET to the low-resistivity state. When Vset is applied, the voltage will remain somewhat constant and the current will increase toward Iset_limit. At some point, the reversible resistance-switching element will be SET and the device behavior will be based on line 462. Note that the first time the reversible resistance-switching element is SET, Vf (the forming voltage) is needed to SET the device. After that, VSET can be used. The forming voltage Vf may be greater than VSET.

While in the low-resistivity state (see line 462), if the voltage VRESET and sufficient current (Ireset) is applied, the reversible resistance-switching element will be RESET to the high-resistivity state.

In one embodiment, Vset is approximately 5 volts, Vreset is approximately 3 volts, Iset_limit is approximately 5 uA and the Ireset current could be about 30 uA.

To determine which state the reversible resistance-switching element is in, a voltage is applied and the resulting current is measured. A higher measured current (see line 462) indicates that the reversible resistance-switching element is in the low-resistivity state. A lower measured current (see line 460) indicates that the reversible resistance-switching element is in the high-resistivity state.

Figure 6A:
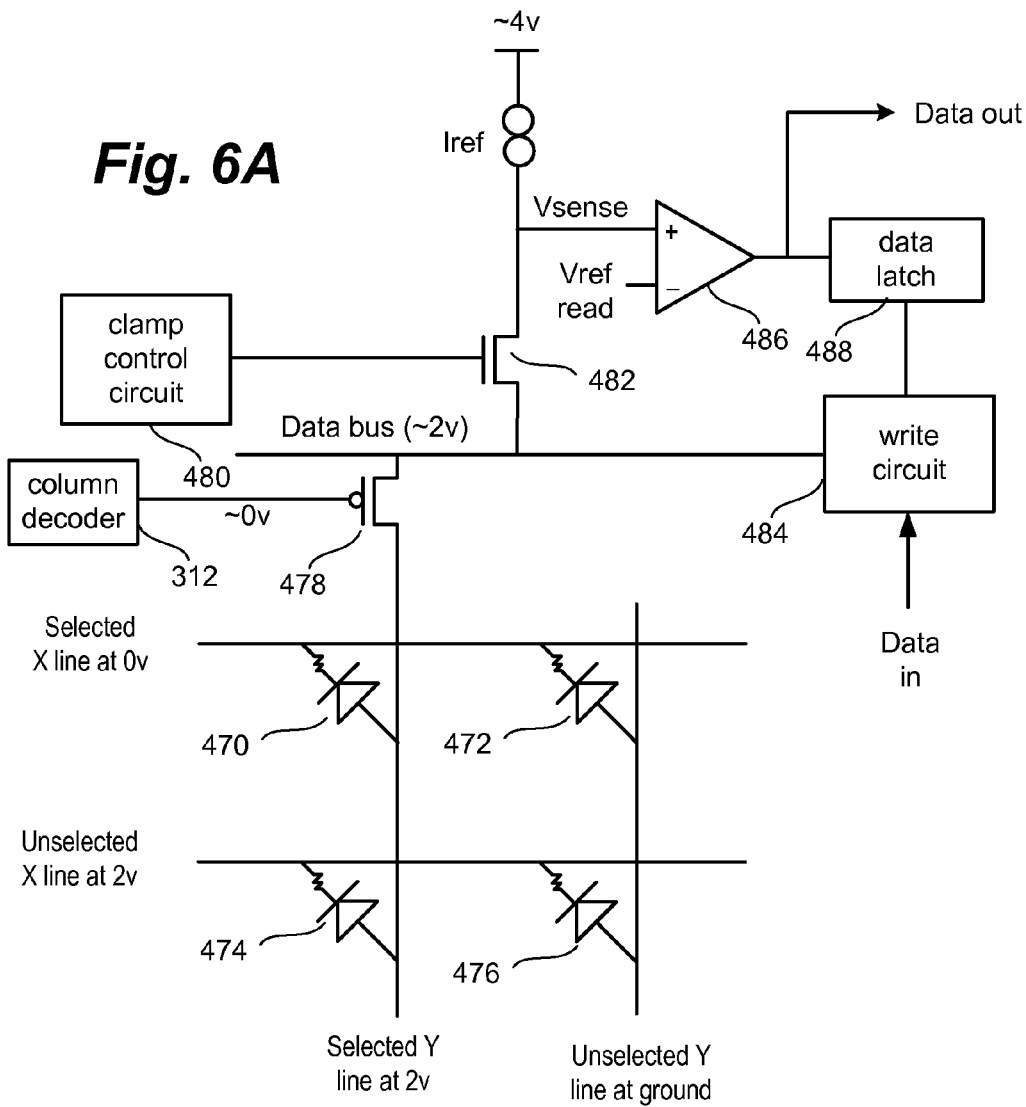
FIG. 6A is a schematic diagram of a portion of one embodiment of a memory array during one embodiment of a Read operation.

FIG. 6A depicts one embodiment of a circuit used for reading the state of a memory cell. FIG. 6A shows a portion of a memory array including memory cells 470, 472, 474 and 476. Two of the many Y lines and two of the many X lines are depicted. A read circuit for one of the Y lines is depicted to be connected to the Y line via transistor 478, which is controlled by a gate voltage supplied by column decoder 312 in order to select or unselect the corresponding Y line. Transistor 478 connects the Y line to a Data bus. Write circuit 484 (which is part of system control logic 330) is connected to the Data bus. Transistor 482 connects to the Data bus and operates as a clamp device that is controlled by clamp control circuit 480 (which is part of system control logic 330). Transistor 482 is also connected to comparator 486 and reference current supply Iref. The output of comparator 486 is connected to a data out terminal (to system control logic 330, a controller and/or a host) and to data latch 488. Write circuit 484 is also connected to data latch 488.

When attempting to read the state of the reversible resistance-switching element, all X lines are first biased at Vread (e.g., approximately 2 volts) and all Y lines are at ground. The selected X line is then pulled to ground. For example purposes, this discussion will assume that memory cell 470 is selected for reading. One or more selected Y lines are pulled to Vread through the data bus (by turning on transistor 478) and the clamp device (transistor 482, which receives ~2 volts+Vt). The clamp device's gate is above Vread, but controlled to keep the Y line near Vread. Current is pulled by the selected memory cell through transistor 482 from the Vsense node. The Vsense node also receives a reference current Iref that is between a high-resistivity state current and a low-resistivity state current. The Vsense node moves corresponding to the current difference between the cell current and the reference current Iref. Comparator 486 generates a data out signal by comparing the Vsense voltage to a Vref-read voltage. If the memory cell current is larger than Iref, the memory cell is in the low-resistivity state and the voltage at Vsense will be lower than Vref. If the memory cell current is smaller than Iref, the memory cell is in the high-resistivity state and the voltage at Vsense will be higher than Vref. The data out signal from comparator 486 is latched in data latch 488 and reported to system control logic 330, a controller and/or a host.

Forward Bias SET and Reverse Bias RESET

Figure 7:
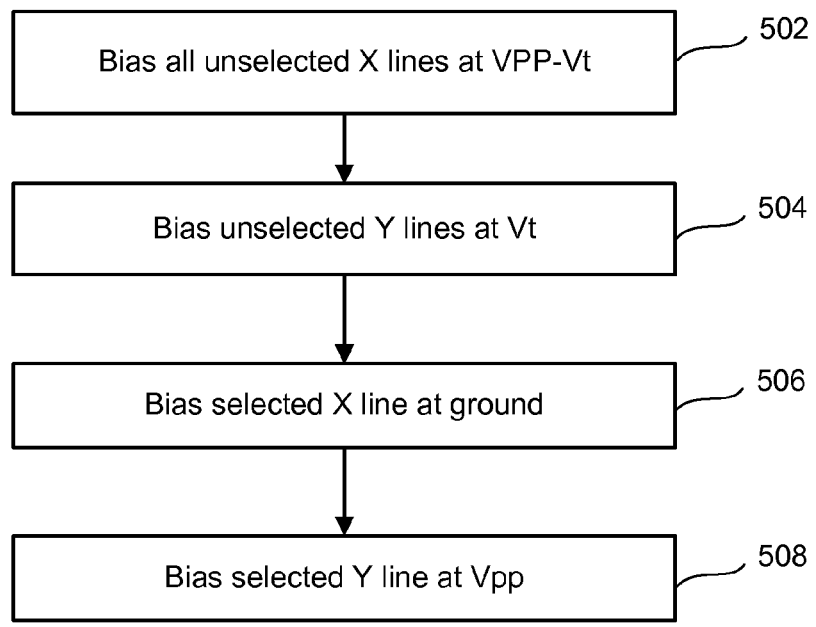
FIG. 7 is a flow chart describing one embodiment of a process for performing a SET of the resistance of one example of a memory cell.

FIG. 7 is a flow chart describing one embodiment of performing a SET operation, which includes changing the state of the reversible resistance-switching element to the low-resistance state. The process of FIG. 7 is performed by row control circuitry 320, column control circuitry 310 and system control logic 330. The process of FIG. 7 describes how one particular memory cell has its reversible resistance-switching material SET. In some embodiments, the process of FIG. 7 can be performed such that multiple memory cells are SET concurrently. In one embodiment, a host may send data to system control logic 330. System control logic 330 will then choose a set of memory cells to store that data. As described above, in one embodiment, each memory cell is at the intersection of one X line and one Y line. Therefore, after system control logic 330 chooses an address in the memory array 302 to store data, row control circuitry 330 and column control circuitry 310 will select a particular X line and a particular Y line that connect to the chosen memory cell. That X line selected by row control circuitry 320 is the selected X line, while other X lines are unselected X lines. The Y line selected by column control circuitry 310 is the selected Y line, while other Y lines are the unselected Y lines. In step 502, the unselected X lines are biased at a voltage of Vpp−Vt. Vpp is at or near 6 volts. In one embodiment, Vpp is the highest voltage available on integrated circuits. In some implementations, the integrated circuit will receive a power signal that will be supplied to one or more charge pumps and voltage controllers. These charge pumps and voltage controls will generate a set of voltages, the highest of which will be Vpp. In other embodiments, Vpp will not be the highest voltage. In one example, Vpp is also the voltage required to SET the reversible resistance-switching element to the low-resistance state, plus the diode drop at the SET current. Vt is an offset voltage equivalent to one diode drop. In one embodiment, the offset voltage is approximately 0.6 volts. Other offset voltages can also be used. In step 504 the unselected Y lines are biased at the offset voltage (approximately 0.6 volts). In step 506, the selected X line is biased at ground. In step 508, the selected Y line is biased at a voltage of Vpp.

Figure 8:
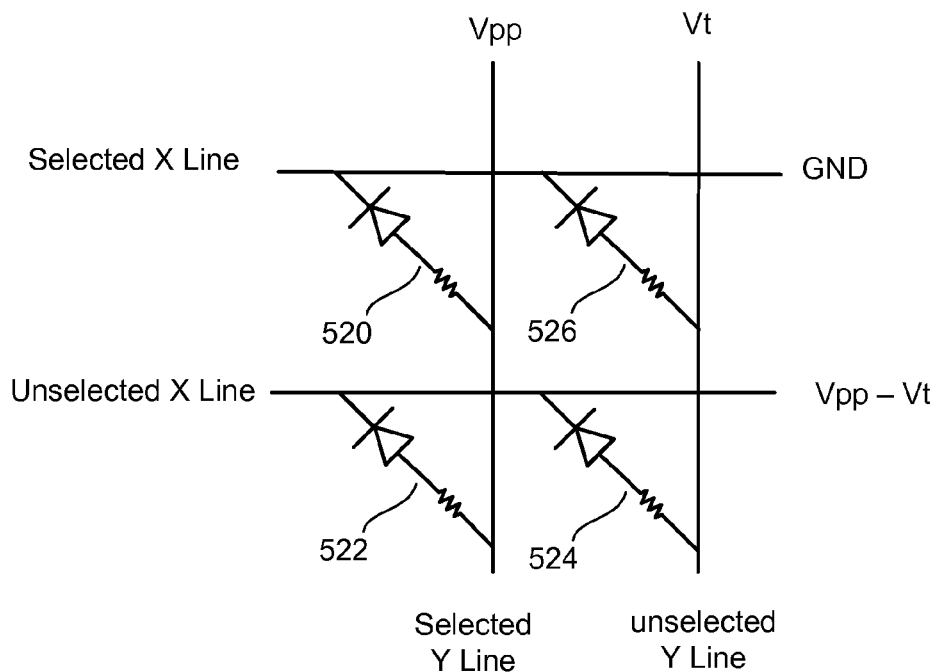
FIG. 8 is a schematic diagram of a portion of one embodiment of a memory array during one embodiment of a SET operation.

FIG. 8 is a schematic of a portion of one level of a three dimensional monolithic memory array. The schematic shows four memory cells 520, 522, 524 and 526. The symbol used for each memory cell includes a symbol for a resistor (representing the reversible resistance-switching element) and a diode (representing a steering device). Note that the diode corresponds to the p/n junction between p+ layer 420 and n− layer 410 of FIG. 4. FIG. 8 shows the various biasing described in the method of FIG. 7. Note that although FIG. 7 shows four steps in a particular order, the steps depicted in FIG. 4 can be performed in other orders, including some of the steps being performed concurrently.

Figure 9:
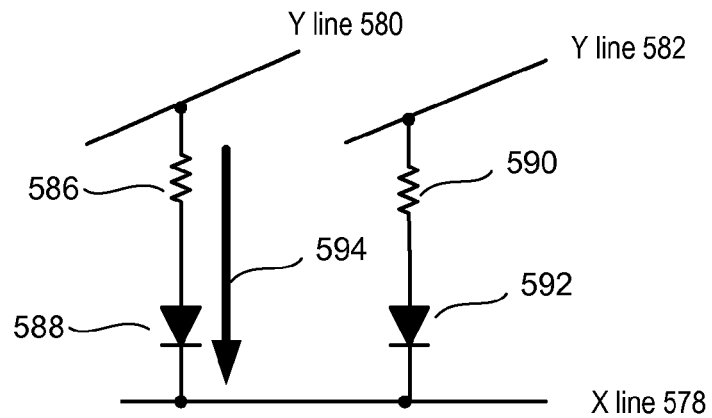
FIG. 9 is a schematic diagram of a portion of one embodiment of a memory array during one embodiment of a SET operation.

FIG. 9 is a schematic of two adjacent memory cells where one of the memory cells is being SET according to the process of FIG. 7. FIG. 7 shows a selected X line (X line) 578, a selected Y line 580 and unselected Y line 582. In one embodiment, X line 578 of FIG. 8 corresponds to Tungsten conductor 404 of FIG. 4, Y line 580 of FIG. 9 corresponds to Tungsten conductor 430 of FIG. 4 and Y line 582 of FIG. 9 corresponds to Tungsten conductor 450 of FIG. 4. The selected memory cell includes reversible resistance-switching element 586 (which corresponds to layer 426 of FIG. 4) and diode 588. In one embodiment, diode 588 represents the pn junction between layer 420 and 410 of FIG. 4. The unselected memory cell includes a reversible resistance-switching element 590 (corresponding to layer 446 of FIG. 4) and a diode 592 corresponding to the pn junction between p+ layer 440 and n− layer 410 of FIG. 4. During the SET operation of FIG. 7, current flows from Y line 580 through reversible resistance-switching element 586 and diode 588 to X line 578 such that diode 588 is forward biased. The SET current is controlled by column control circuitry 310.

Partial etching into the device rail increases the punch through voltage between adjacent pillar layers. Optional implant into the device rail after etch of the pillar can also be used to increase punch though voltage. More details about programming in general can be found in U.S. Pat. No. 6,822,903, which is incorporated by reference in its entirety. In one embodiment, before the first target memory cell is SET, it must be "formed." The forming process is typically required for reversible resistance-switching elements comprising metal oxides. The forming process is similar to the SET operation, but with a higher voltage and a longer time. In one embodiment, the forming process can be performed during manufacturing where temperatures and voltages are controlled to tighter specifications than in the user environment.

Figure 10:
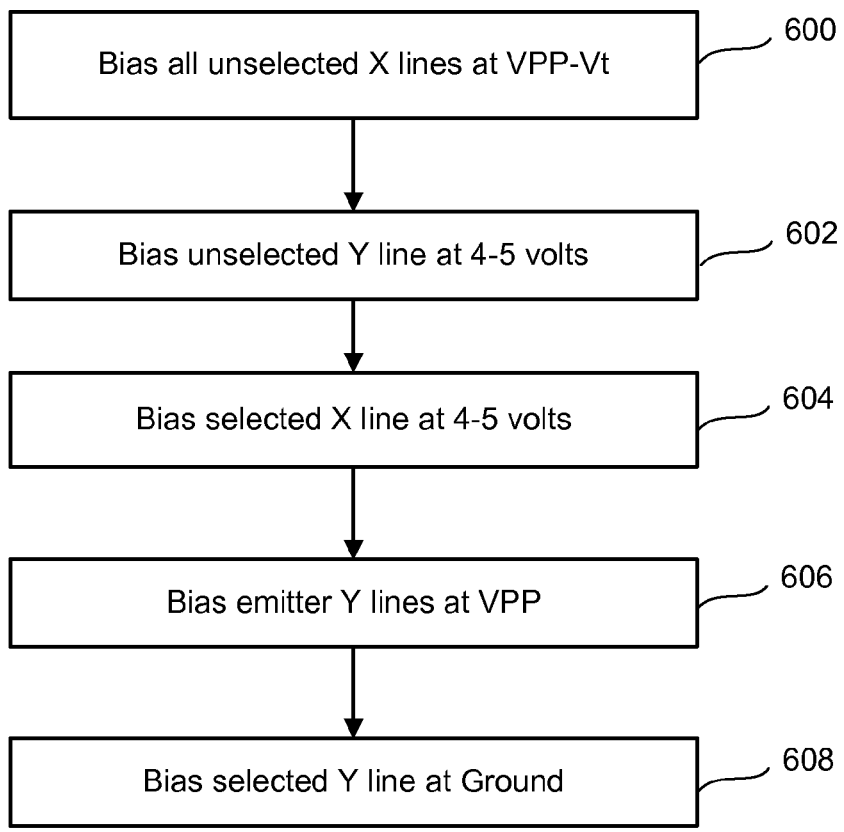
FIG. 10 is a flow chart describing one embodiment of a process for performing a RESET operation for one example of a memory cell.

FIG. 10 is a flow chart describing one embodiment of a process for performing a RESET operation on a memory cell. In some embodiments, the process of FIG. 10 is performed on multiple memory cells concurrently such that multiple cells are RESET at the same time. In other embodiments, only one memory cell will be RESET at a time. The process of FIG. 10 is performed by column control circuitry 310, row control circuitry 320 and system control logic 330.

In step 600 of FIG. 10, a voltage of approximately Vpp−Vt is applied to the unselected X line. In step 602, unselected Y lines (other than the emitter Y line) are biased between 4 to 5 volts, the same as the selected X line, in order to not cause extra current to flow to the selected X line. In step 604, the selected X line is biased at a voltage between 4 and 5 volts. In step 606, the emitter Y line is biased at Vpp. The emitter Y line is a Y line next to the selected Y line that will be a source of current during programming operation. More details of the emitter Y line are provided below. In some embodiments, it may be preferred that the memory cell connected to the emitter Y line and the same selected X line is in a conductive state. In step 608, the selected Y line is biased at ground. Note that the unselected X line can also be at a voltage level between Vpp and Vpp−Vt or in a range of 5.5 to 6 volts so as not draw current from the emitter Y line.

Figure 11:
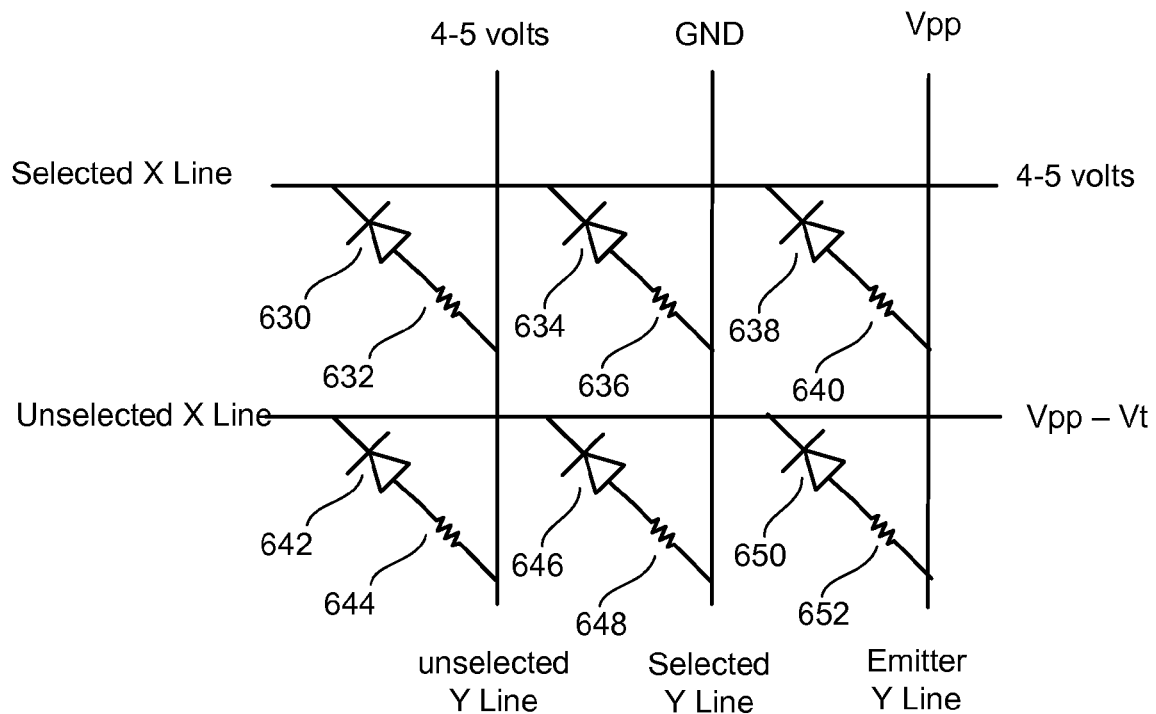
FIG. 11 is a schematic diagram of a portion of one embodiment of a memory array during one embodiment of a RESET operation.

FIG. 11 is a schematic of a portion of a three dimensional monolithic memory array showing the biasing of the various lines as described by the process of FIG. 10. Note that although the process of FIG. 10 shows five steps being performed sequentially, the steps can be performed in other orders, including some of the steps being performed concurrently. The schematic of FIG. 11 shows the unselected Y line and selected Y line, the emitter Y line, the unselected X line and selected X line. The schematic of FIG. 11 also shows six memory cells. The first memory cell is depicted by diode 630 and reversible resistance-switching element 632. The second memory cell is depicted by diode 634 and reversible resistance-switching element 636. The third memory cell is depicted by diode 638 and reversible resistance-switching element 640. The fourth memory cell is depicted by diode 642 and reversible resistance-switching element 644. The fifth memory cell is depicted by diode 646 and reversible resistance-switching element 648. The sixth memory cell is depicted by diode 650 and reversible resistance-switching element 652. The selected memory cell in this example is the memory cell with diode 634 and reversible resistance-switching element 636 because that memory cell is connected to the selected X line and the selected Y line.

Figure 12:
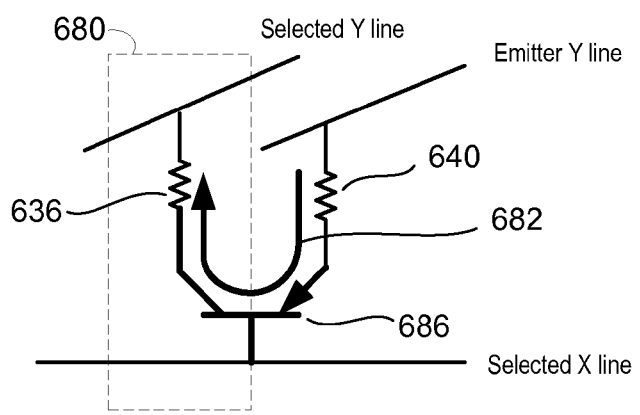
FIG. 12 is a schematic diagram of a portion of one embodiment of a memory array during one embodiment of a RESET operation.

With the voltage biases applied to the X lines and Y lines as described above in FIGS. 10 and 11, the pn junction for diode 634 (e.g. pn junction between p+ layer 420 and n− layer 410) is reverse biased. Thus, looking back at FIG. 5, and assuming that Tungsten layer 430 is the selected Y line and Tungsten layer 450 is the emitter Y line; p+ layer 420, n− layer 410 and p+ layer 440 act like a bipolar transistor. The voltage applied to the emitter Y line (W layer 450), which is approximately 6 volts, causes a current to flow from the emitter Y line through reversible resistance-switching element 640 (e.g. layer 446 of FIG. 4) through p+ layer 440, into n− layer 410, into p+ layer 420, through reversible resistance-switching material 426 (reversible resistance-switching element 636 of FIG. 11), and into the selected Y line. This current flow is depicted in FIG. 12 by arrow 682. Thus, the neighboring Y line acts as an emitter line for the memory cell 680, which includes reversible resistance-switching element 636. Because p+ layer 420, n− layer 410 and p+ layer 440 are acting like a bipolar transistor, the schematic of FIG. 12 depicts bipolar transistor 686 rather than two diodes, in order to show current flow during the RESET operation.

Reverse Bias SET and Forward Bias RESET

In the above discussion with respect to FIGS. 6-11, the pn junction between p+ layer 420 and n− layer 410 was forward biased for a SET operation and reverse biased for a RESET operation. In another embodiment, depicted by FIG. 13, the pn junction between p+ layer 420 and n− layer 410 can be reverse biased for a SET operation and forward biased for a RESET operation. For example, FIG. 13 is a schematic diagram showing a selected Y line, emitter Y line and selected X line. Two memory cells are depicted. A first memory cell is connected to the selected Y line and includes reversible resistance-switching element 802. The second memory cell is connected to the emitter Y line and includes reversible resistance-switching element 804. During a SET operation of reversible resistance-switching element 802, current flows as depicted by arrow 810 from emitter Y line to the selected Y line through reversible resistance-switching element 804 and reversible resistance-switching element 802. Looking back at FIG. 4 and assuming that the selected Y line is Tungsten layer 430 and the emitter Y line is Tungsten layer 450, the current would flow from Tungsten layer 450 to reversible resistance-switching material 446, to p+ layer 440, to n− layer 410, to p+ layer 420, to reversible resistance-switching material 426, to Tungsten layer 430. With such a current flow, p+ layer 420, n− layer 410 and p+ layer 440 act as a bipolar transistor, as depicted by transistor 808 in FIG. 13.

When performing a RESET operation, the current flows as depicted by arrow 812 of FIG. 13. That is, during a RESET operation current flows from the selected Y line to the selected X line. Looking back at FIG. 4, the current would flow from Tungsten layer 430 to reversible resistance-switching material 426, to p+ layer 420, to n− layer 410, to n+ layer 408, to Tungsten layer 404. In the above discussion, the TiN layers were omitted to shorten the discussion, but the current would flow through those layers too.

To allow the SET operation as described with respect to FIG. 13, it is preferable that the reversible resistance-switching element 804 connected to the emitter Y line is in a conductive state, such as the low-resistance state, prior to trying to performing the SET operation for the selected memory cell (reversible resistance-switching element 802). As mentioned above, there will be many memory cells connected to a common X line (e.g. the selected X line). Thus, in this embodiment, it is preferable that at least one memory cell on the common X line is in the conductive state at all times. The memory cell that is in the conductive state can act as the emitter line in order to RESET another memory cell. Then, the newly SET memory cell can act as an emitter for a SET operation for the next memory cell, and so on. In this manner, a sequence of SET operations can be performed in a "zipper" fashion. That is, for a given set of adjacent memory cells connected to a common X line, the memory cells can be RESET in consecutive order starting on one side, thereby providing the analogy of a zipper. This embodiment contemplates that each X lines will have one (or more than one) memory cell statically in the conductive state. In one implementation, the conductive state is the low resistance state. In another implementation, the conductive state is different than the low resistance state. In some embodiment, the conductive state has a resistance approximately equal to the resistance of the low-resistance state. In other embodiments, the conductive state has a resistance that is lower than the resistance of the low resistance state so that the conducive state is more conductive than the low resistance state. Such a conductive state may be produced by different pulses than the SET operation described above. The phrase statically in the conductive state means that the memory cell will stay in the conductive state during the entire operational life of the memory array or during a specific period of interest of the operational life of the memory array. In one embodiment, the memory cell that is statically (as opposed to able to dynamically change during the period of interest) in the conductive state is permanently in the conductive state.

FIG. 14 is a flow chart describing one embodiment of a process for forming a particular memory cell that is to be permanently in a conductive state. The process of forming puts the reversible resistance-switching element of that memory cell permanently in a conductive state. This process can be performed by the memory system upon first operation, during user operation or during the manufacturing phase. In step 830 of FIG. 14, the unselected X lines are biased at 5.5 volts. In step 832, the unselected Y lines are biased at 0.7 volts. In step 834, the selected X line is biased at ground. The memory cell to be permanently in a conductive state is connected to the selected X line and the selected Y line. In step 836, high voltage (e.g., approximately 9 volts in magnitude) pulses are applied to the Y line connected to the memory cell to be permanently put in a conductive state. In one example of the forming operation, element 804 would be a metal oxide layer. The voltage, in step 836, is applied for a sufficiently long time to the metal oxide element 804 in order to breakdown the metal oxide element 804 to a permanent conductive state in the manner of oxide anti fuses. In one embodiment, the memory cell permanently in a conductive state (or statically in the conductive state) is referred to as a dummy memory cell because it does not store user data and the Y line connected to that dummy memory cell is referred to as the dummy Y Line. The steps of FIG. 14 can be performed in different order than as depicted. In some embodiment, one or more of the steps are performed concurrently.

FIG. 15 is a partial schematic that graphically depicts a portion of a memory array and the various voltages described above in FIG. 14. That is, FIG. 15 shows a selected X line, Y line 1, Y line 2, Y line 3, Y line 4, and a dummy Y line. FIG. 15 also shows memory cell 880, 882, 884, 886 and 888. Memory cell 880 is connected to Y line 1 and the selected X line. Memory cell 882 is connected to Y line 2 and the selected X line. Memory cell 884 is connected to Y line 3 and the selected X line. Memory cell 886 is connected to Y line 4 and the selected X line. Memory cell 888 is connected to the dummy Y line and the selected X line. FIG. 15 shows the selected X line biased at ground and a dummy Y line receiving 9 volt pulses. The other Y lines receive 0.7 volts. Arrow 890 indicates current flow from the dummy Y line to the selected X line as a result of the voltage biases depicted. As a result of that current depicted by arrow 804, dummy memory cell 888 is statically (or permanently) put in the conductive state.

Figure 16:
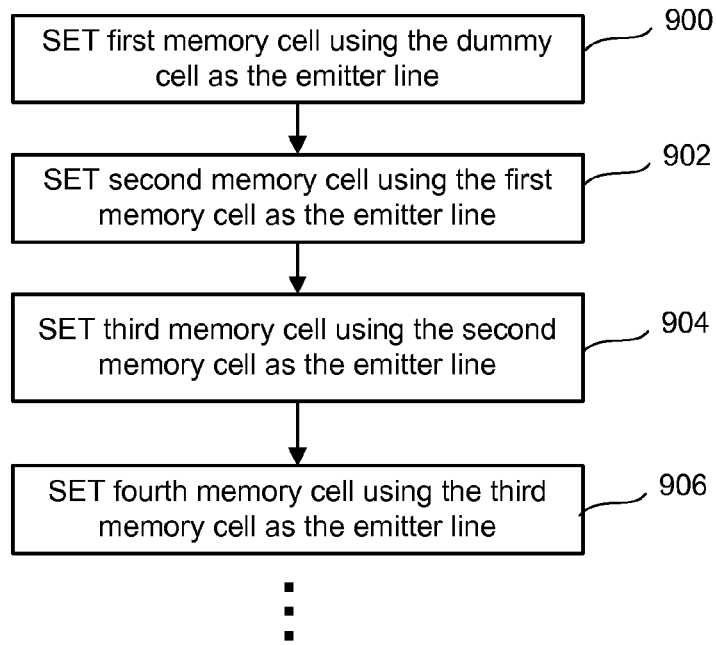
FIG. 16 is a flow chart describing one embodiment of a process for performing a SET operation for a memory array.

FIG. 16 is a flow chart describing one embodiment of a zipper process that SETs the memory cells using the dummy memory cell. In step 900, the first memory cell will be SET using the dummy memory cell as the emitter line. In step 902, the second memory cell will be SET using the first memory cell as the emitter line. In step 904, the third memory cell will be SET using the second memory cell as the emitter line. In step 906, the fourth memory cell will be SET using the third memory cell as the emitter line. And so on. For example, looking back at FIG. 15, after forming memory cell 888 to be permanently in the low-resistance state, a SET operation will be performed for memory cell 886, followed by a SET operation for memory cell 884, followed by a SET operation for memory cell 882, followed by a SET operation for memory cell 880, and so on.

Figure 17:
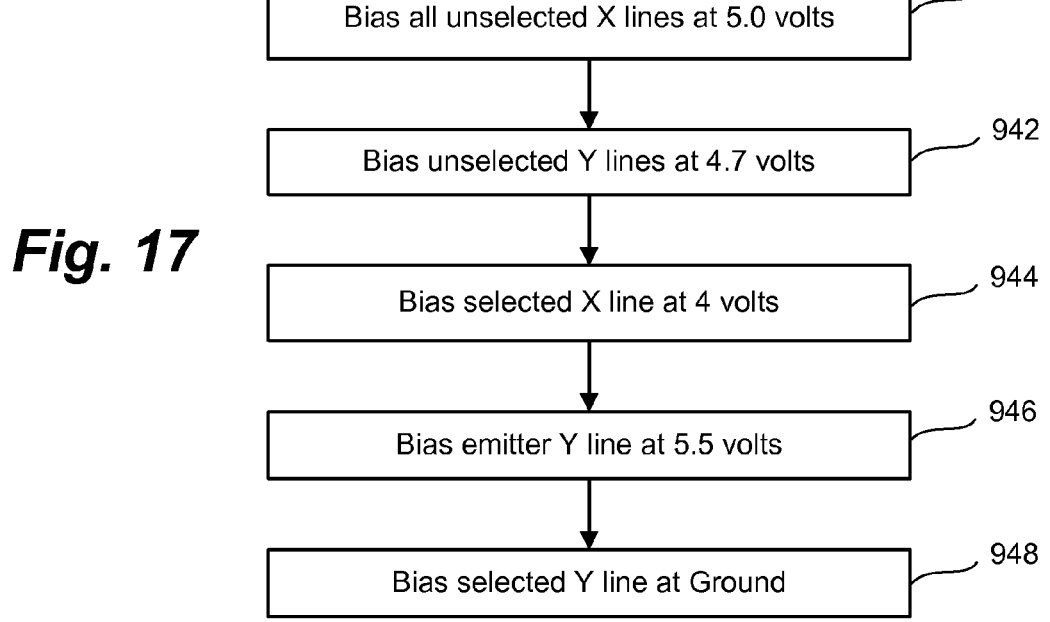
FIG. 17 is a flow chart describing one embodiment of a process for performing a SET operation for a memory cell.

FIG. 17 is a flow chart describing the process for performing a SET operation on any one of the memory cells connected to the common X line. For example, the process of FIG. 17 can be performed as an example implementation of any one of steps 900-906. The process of FIG. 17 is performed by column control circuitry 310, row control circuitry 320 and system control logic 330.

Figure 18:
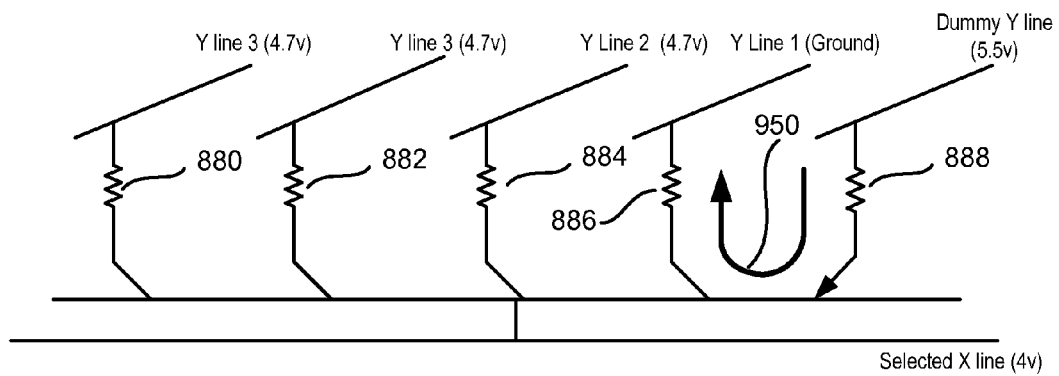
FIGS. 18-21 are schematic diagrams of a portion of one embodiment of a memory array during one embodiment of a SET operation.

In step 940 of FIG. 17, the unselected X lines are biased at 5 volts. In step 942, the unselected Y lines (other than the emitter Y line) receive 4.7 volts. In step 944, the selected X line is biased at 4 volts. In step 946, the emitter Y line is biased at 5.5 volts. If memory cell 886 is being set, then the emitter Y line is the dummy Y line. If memory cell 880 is being set, then the emitter Y line is Y line 2. In step 948, the selected Y line is biased to ground. FIG. 18 is a schematic diagram showing memory cells 880-888 as a result of performing the process of FIG. 17 during step 900. That is, FIG. 18 shows the memory cells and the various voltage levels applied when performing a SET operation for the first memory cell 886. As can be seen, dummy Y line is being used as the emitter Y line. Arrow 950 shows the flow of current from the dummy Y line to Y line 1 via memory cell 888 and memory cell 886. Looking back at FIG. 4, the current flows from Tungsten layer 450 to reversible resistance-switching material 446, to p+ layer 440, to n− layer 410, to p+ layer 420, to reversible resistance-switching material 426, to Tungsten layer 430. In this manner, p+ layer 440, n− layer 410 and p+ layer 420 act like a bipolar transistor.

Figure 19:
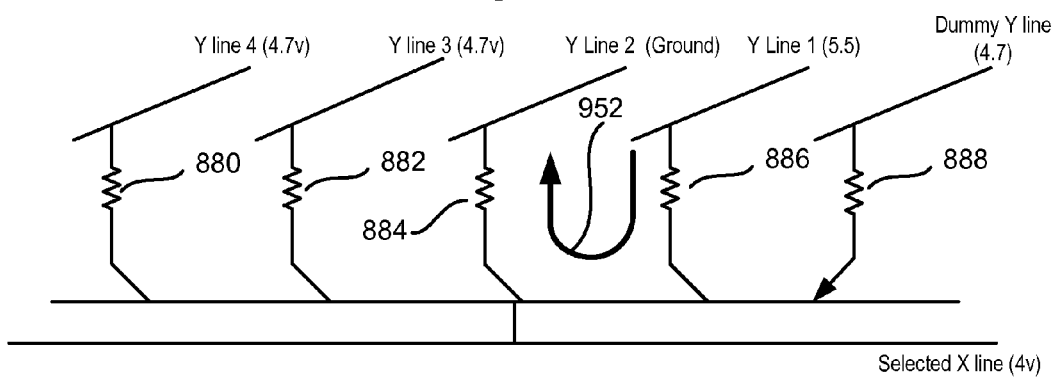

FIG. 19 is a schematic diagram depicting memory cells 880-888. FIG. 19 shows the biasing of the various Y lines and the selected X line as a result of performing the process of FIG. 17 during step 902 of FIG. 16. As can be seen, arrow 952 depicts the flow of current from Y line 1 to Y line 2 via memory cell 886 and memory cell 884. In this operation, memory cell 886 and Y line 1 serve as the emitter line for memory cell 884. With respect to the layers described in FIG. 4, the current flows in the manner discussed above with respect to FIG. 18.

Figure 20:
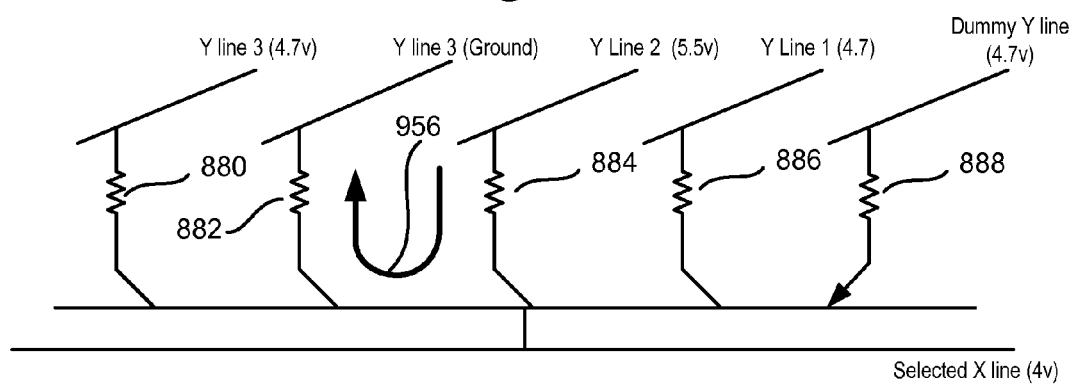

FIG. 20 is a schematic diagram depicting memory cells 880-888 and the voltages applied to the various Y lines and the selected X line as a result of performing the process of FIG. 17 during step 904 of FIG. 16. As can be seen from FIG. 20, Y line 2 and memory cell 884 serve as the emitter line for performing the SET operation for memory cell 882. The current is depicted by arrow 956 as flowing from Y line 2 to Y line 3 via memory cells 884 and 882.

Figure 21:
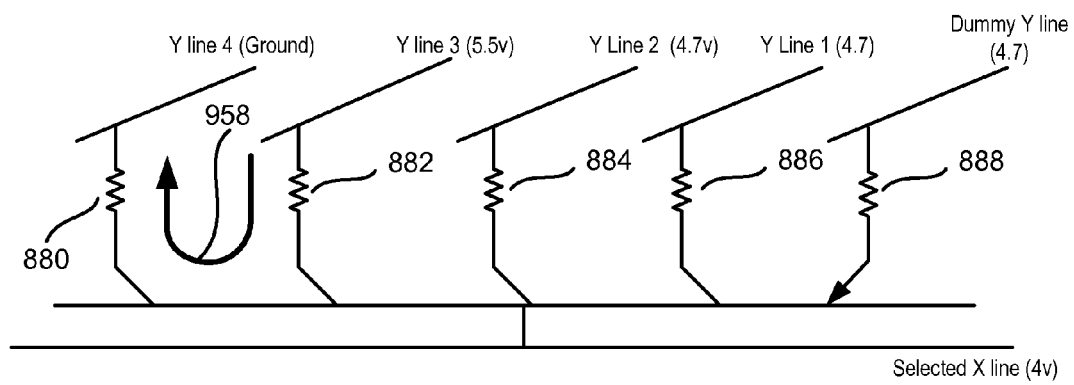

FIG. 21 is a schematic diagram of memory cells 880-888, as well as the various Y lines and the selected X line. FIG. 21 shows the voltage applied to the Y lines and the selected X line as a result of performing the process of FIG. 17 during step 906 of FIG. 16. As can be seen, Y line 3 and memory cell 882 serve as the emitter line for performing the SET operation for memory cell 880. An arrow 958 represents the current flow during the SET operation that flows from Y line 3 to Y line 4 via memory cells 882 and 880. With respect to the layers described in FIG. 4, the current flows in the manner discussed above with respect to FIG. 18.

Figure 22:
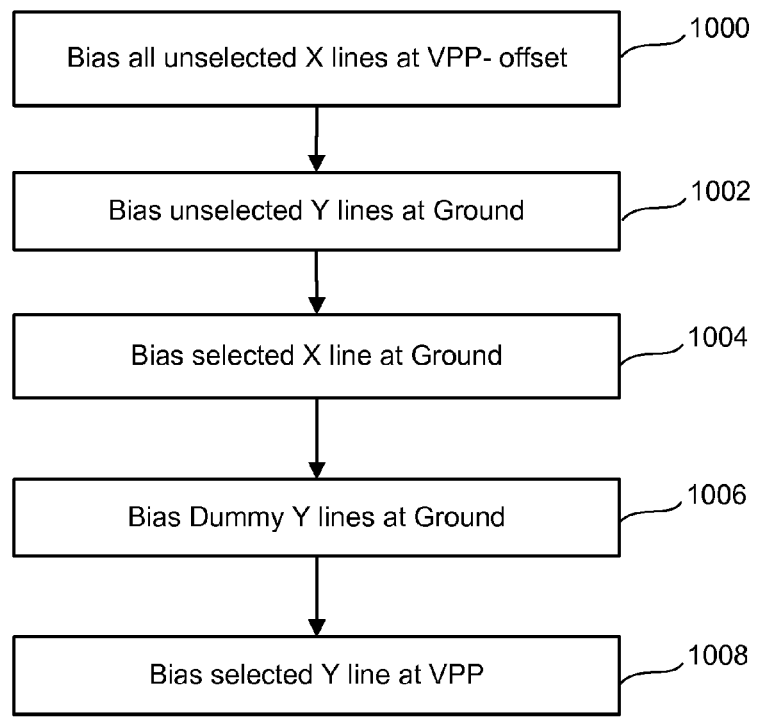
FIG. 22 is a flow chart describing one embodiment of a process for performing a RESET operation for a memory cell.
Figure 23:
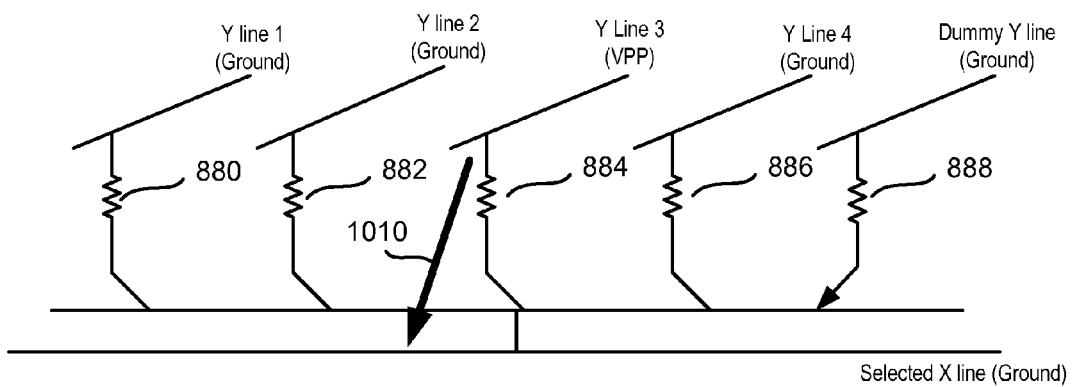
FIG. 23 is a schematic diagram of a portion of one embodiment of a memory array during one embodiment of a RESET operation.

FIG. 22 is a flow chart describing one embodiment of a RESET operation performed on any of memory cells 880-888 (as well as other memory cells in a three dimensional monolithic memory array) that were SET according to the process of FIG. 17. In this process, the RESET operation configures the selected cell junction to be forward biased, with no bipolar transistor action. In step 1000, the unselected X lines are biased at Vpp-offset. In one embodiment, Vt is an offset, as described above. In step 1002, the unselected Y line receives ground potential. In step 1004, the selected X line is biased at ground. In step 1006, the dummy Y line is biased at ground. In one embodiment, each X line will have one dummy memory cell and all of the dummy memory cells are connected to the same dummy Y line. In other embodiments, each X line can include multiple dummy memory cells so that there are multiple dummy Y lines. In other embodiments, the dummy memory cells can be connected to different dummy Y lines. In step 1008, the selected Y lines are biased at Vpp FIG. 23 is a schematic drawing of memory cells 880-888 during a RESET operation for memory cell 884. The dummy Y line and the unselected Y lines receive a ground potential while Y line 3 receives Vpp. The selected X line (common to memory cells 880-888) also receives ground. A current flows, as represented by arrow 1010, from Y line 3 to the selected X line. This current will cause the memory cell 884 to RESET to the high-resistance state.

In the above embodiments of FIGS. 13-23, the zipper method was used to SET the memory cell. In an alternative embodiment, the zipper method can be used with respect to the embodiment of FIGS. 6-11 to RESET the memory cell. In such an embodiment, there will still be a need for one dummy memory cell statically in a conductive state.

Multi-Collector Memory Cell

One embodiment uses multiple reversible resistance-switching elements to create multi-bit memory cells. That is, in the discussion above, each memory cell included one resistance-switching element that could be in one of two states. Therefore, each memory cell stores one bit of data. In other embodiments, one reversible resistance-switching element can be put into any one of four or eight resistance states. In that case, the reversible resistance-switching element can store two or three (or more) bits of data. In another embodiment, multi-bit memory cells can be achieved using more than one reversible resistance-switching element. In one example, a memory cell includes multiple reversible resistance-switching elements that can each be in the high or low resistance state (or more than two states).

Figure 24:
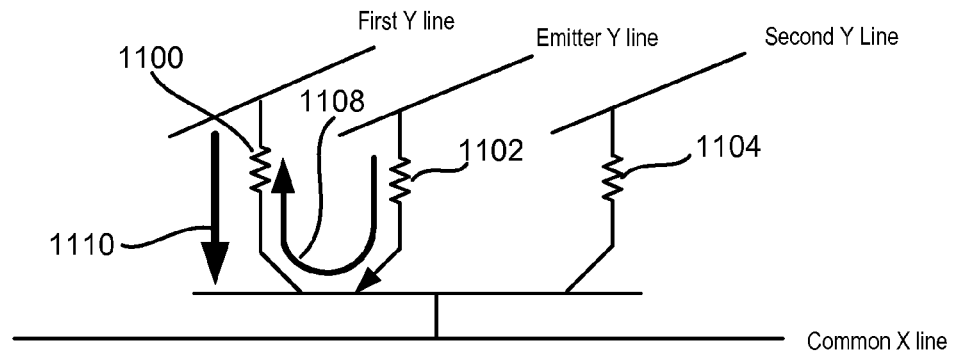
FIG. 24 is a schematic diagram of a portion of one embodiment of a memory array.

FIG. 24 is a schematic drawing showing one example of a multi-bit memory cell that uses multiple reversible resistance-switching elements. Another name for a memory cell with multiple reversible resistance-switching elements is a multi-collector memory cell since each of the reversible resistance-switching elements that can store user data can serve as a collector (for the bipolar transistor action described herein) during the SET operation for that reversible resistance-switching element. The multi-bit memory cell of FIG. 24 shows three resistance elements 1100, 1102 and 1104. In one embodiment, elements 1100 and 1104 are reversible resistance-switching elements, and element 1102 is statically in a conductive state, such as the conductive state described above. Element 1102 is referred to as a static resistance element because its resistance is not switchable during normal user operation of the memory device. Statis resistance element 1102 can be material that is always in a conductive state or reversible resistance-switching material that is statically put in a conductive state. The Y line for the statis resistance element that is statically in the conductive state is referred to as the Emitter line because it serves as the emitter when the p, n and p materials that act like a transistor, as discussed herein.

FIG. 24 shows a reversible resistance-switching element 1100 connected between a first Y line and the common X line, and reversible resistance-switching element 1104 connected between the second Y line and the common X line. When either reversible resistance-switching element 1100 or 1104 are RESET to the high-resistance state, current will flow from the respective Y line to the common X line. For example, arrow 1110 shows current being passed from the first Y line to the common X line when performing a RESET operation for memory element 1100. When either memory element is SET, current will flow between two Y lines of the memory cell. In one example, when the first reversible resistance-switching element is SET, current will flow from the Y line connected to the static resistance element to the Y line connected to the reversible resistance-switching element being SET. When the second reversible resistance-switching element is SET, current will flow from the Y line connected to the static resistance element to the Y line connected to the second reversible resistance-switching element being SET. In another embodiment, when the second reversible resistance-switching element is SET current will flow from the Y line connected to the first reversible resistance-switching element that was already SET to the Y line connected to the second reversible resistance-switching element being SET. FIG. 24 shows arrow 1108 representing current from the emitter Y line (the Y line for static resistance element 1102) to the first Y line.

Each of the two reversible resistance-switching elements can either be in the high-resistance state or the low-resistance state; therefore, the memory cell as a whole can be in four different data states as represented by the table below:

|  | Reversible Resistance-Switching Element 1100 | Reversible Resistance-Switching Element 1104 |
| --- | --- | --- |
| Data State A | H | H |
| Data State B | H | L |
| Data State C | L | H |
| Data State D | L | L |

Figure 25:
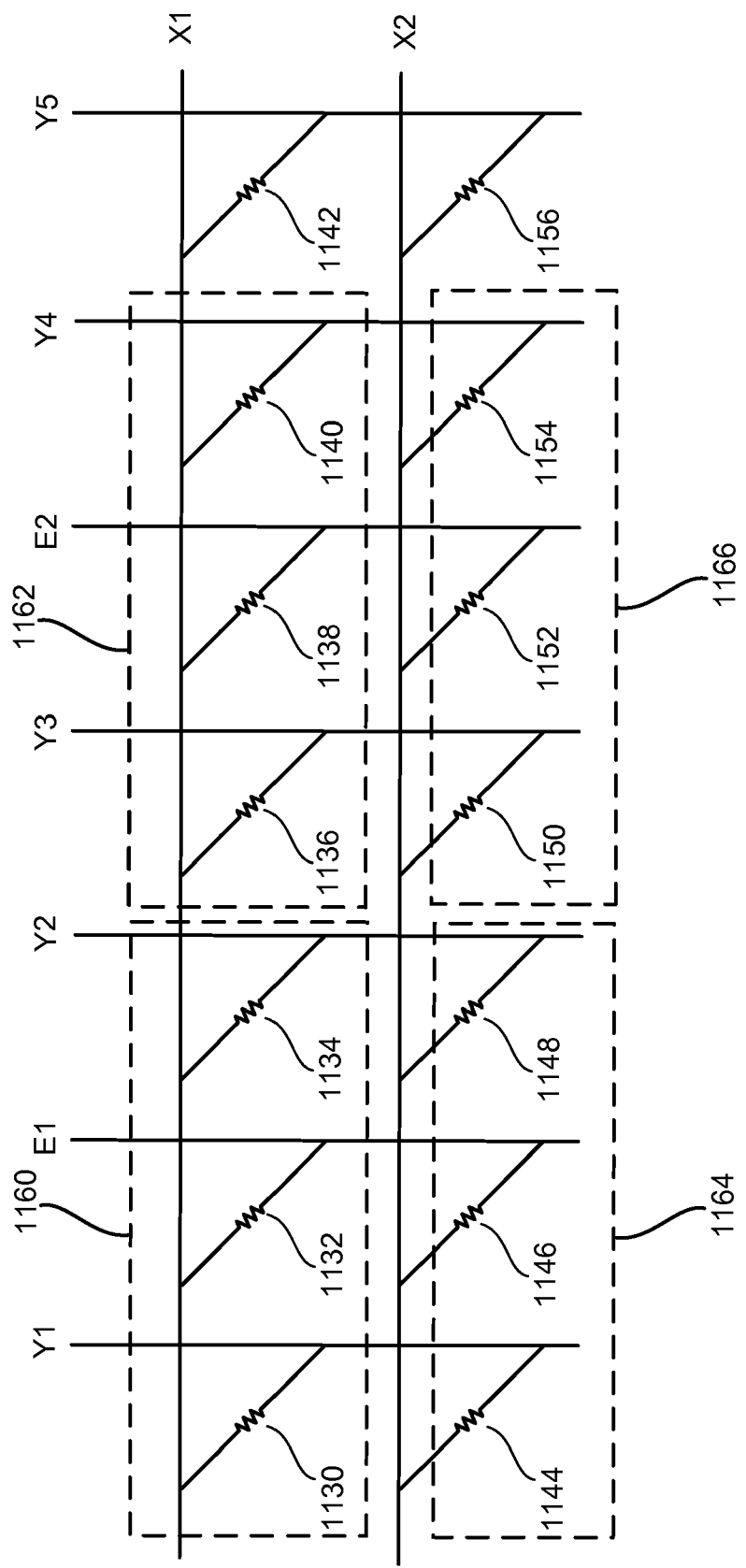
FIG. 25 is a schematic diagram of a portion of one embodiment of a memory array.

FIG. 25 is a schematic diagram showing a portion of one level of a three dimensional monolithic memory array. The schematic of FIG. 25 shows elements 1130, 1132, 1134, 1136, 1138, 1140, 1142, 1144, 1146, 1148, 1150, 1152, 1154 and 1156. FIG. 25 shows portions of two X lines (X1 and X2) and portions of seven Y lines (Y1, Y2, Y3, Y4, Y5, E1 and E2). It is contemplated that along an X line, there are much more reversible resistance-switching elements than those depicted in FIG. 25. The various elements along an X line are grouped together to form the multi-bit memory cells. For example, FIG. 25 shows four memory cells 1160, 1162, 1164 and 1166. Memory cell 1160 includes reversible resistance-switching element 1130, reversible resistance-switching element 1134, and static resistance element 1132. Memory cell 1162 includes reversible resistance-switching element 1136, reversible resistance-switching element 1140, and static resistance element 1138. Memory cell 1164 includes reversible resistance-switching element 1144, reversible resistance-switching element 1148, and static resistance element 1146. Memory cell 1166 includes reversible resistance-switching element 1150, reversible resistance-switching element 1154, and static resistance element 1152.

Figure 26:
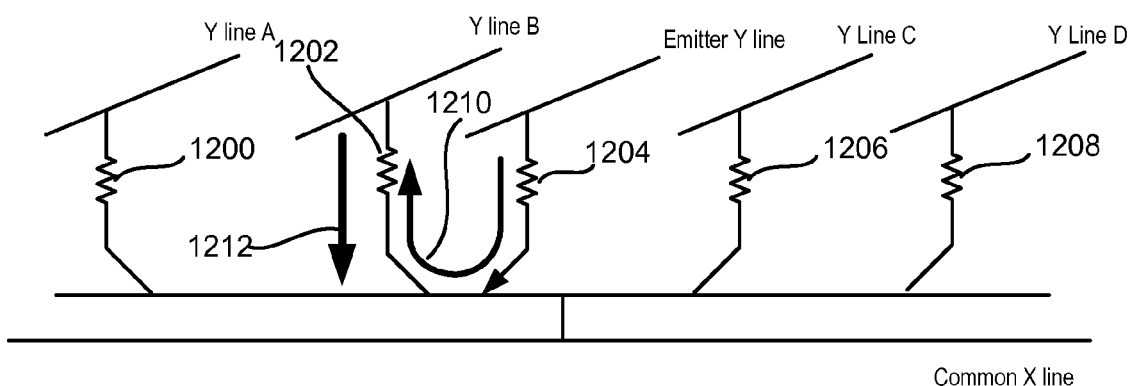
FIG. 26 is a schematic diagram of a portion of one embodiment of a memory array.

The memory cells in FIGS. 24 and 25 include two reversible resistance-switching elements that can store user data and one static resistance element. In other embodiments, more than two reversible resistance-switching elements can be used. For example, the memory cell of FIG. 26 includes four reversible resistance-switching elements including reversible resistance-switching element 1200 connected between Y line A and the common X line, reversible resistance-switching element 1202 connected between Y line B and the common X line, reversible resistance-switching element 1206 connected between Y line C and the common X line, reversible resistance-switching element 1208 connected between Y line D and the common X line and static resistance element 1204 connected between the emitter Y line and the common X line. Other embodiments can include three reversible resistance-switching elements for storing user data or more than four reversible resistance-switching elements for storing user data.

Figure 27:
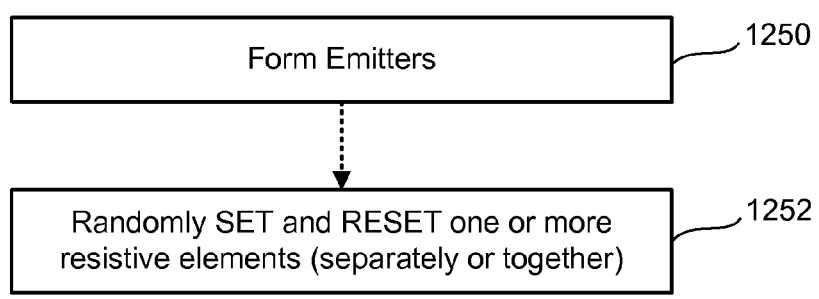
FIG. 27 is a flow chart describing one embodiment of a process for operating a memory array.

FIG. 27 is a flow chart describing one embodiment of a process for operating a memory array with multi-bit memory cells as discussed above with respect to FIGS. 24-26. In step 1250 of FIG. 27, the emitters of each memory cell will be formed. As discussed above, in one embodiment, one of the resistance elements in each memory cell will be dedicated as a static resistance element in a conductive state. In step 1250, that memory cell dedicated to be in the conductive state will be formed to be in that conductive state either permanently or semi-permanently. In step 1252, the other reversible resistance-switching elements will be randomly SET and RESET (separately or concurrently) based on data being stored by a user of the memory system. There is a dotted line between steps 1250 and 1252 to indicate that a random and unpredictable amount of time can occur between steps 1250 and 1252.

FIG. 28 is a flow chart describing a process for performing another embodiment of operating a three dimensional memory array with multi-bit memory cells. In step 1256, the emitters for each memory cell are formed. In step 1258, the system (see FIG. 3) will receive data from a host (or other device). There is a dotted line between steps 1256 and 1258 to indicate that a random and unpredictable amount of time can occur between steps 1256 and 1258. The data received from the host is received by system control logic 330 (or another element). In step 1260, system control logic 330 will assign multiple bits of data to each memory cell of a set of multi-bit memory cells. In step 1262, all the memory cells to be programmed will have each reversible resistance-switching element RESET to the high-resistance state. In one embodiment, memory cells can be programmed on a block by block basis, bay by bay basis, X line by X line basis, page by page basis, or other unit of programming. At the end of step 1262, the unit of programming includes memory cells that have all of their reversible resistance-switching elements RESET to the high-resistance state. At this point, the various memory cells will be programmed into any of the four states described above in the table above. In step 1264, the first bit of a subset of memory cells to be programmed are SET to the low-resistance state. More than one memory cell can be programmed at the same time. Because some memory cells will store different data, not all the memory cells will have their first bit SET. For example, if each memory cell has a first bit and second bit, some of the memory cells will have their first bit SET to the low-resistance state and others will keep their first bit in the high-resistance state so that some of the bits can store 1 and some of the bits can store data 0. In step 1266, the second bit for a subset of memory cells is SET to the low resistance state. Multiple memory cells can have their bits set concurrently or they can be done consecutively. Again, some of the memory cells will keep their second reversible resistance-switching elements in the high-resistance state and others will SET the second reversible resistance-switching element to the low-resistance state so that different memory cells will store data 1 or data 0. In step 1268, it is determined whether there is any more data to be programmed. If not, the process is done. If so, the process loops back to step 1264 and more memory cells are programmed. In some embodiments, only a small number of memory cells can be concurrently programmed. Therefore, the loop of steps 1264 and 1266 must be repeated for each group of memory cells that can be concurrently programmed.

Figure 29:
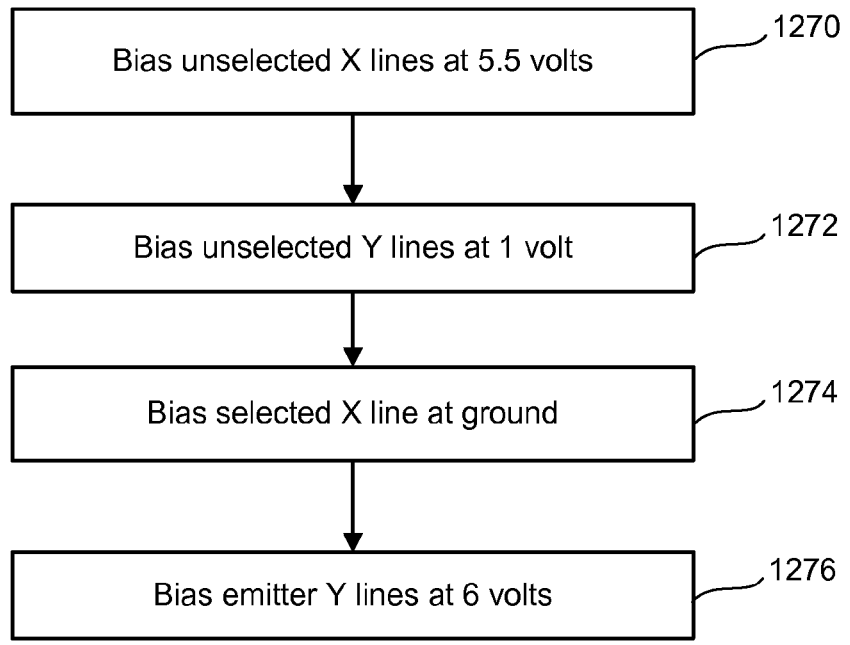
FIG. 29 is a flow chart describing one embodiment of a process for performing a Forming operation.

FIG. 29 is a flow chart describing one embodiment for forming the static resistance elements. The process of FIG. 29 can be used to implement steps 1250 of FIG. 27 or 1256 of FIG. 28. In step 1270, the unselected X lines are biased at 5.5 volts. In step 1272, unselected Y lines are biased at 1 volt. In step 1274, the selected X line is placed at ground. Again, the selected X line and selected Y line are those lines that connect to the reversible resistance-switching element that will serve as the emitter (sometimes known as the dummy). In step 1276, the emitter Y line is biased at 6 volts. As a result of the process of FIG. 29, one or more static resistance elements are formed to be in the conductive state.

Figure 30:
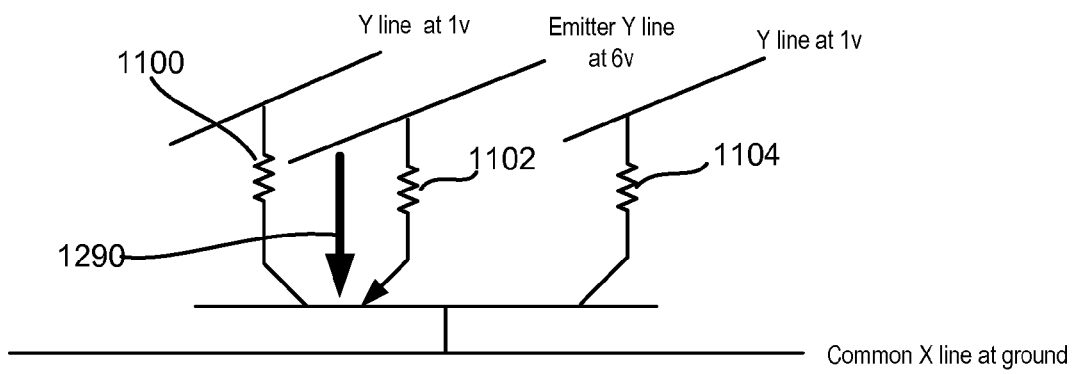
FIG. 30 is a schematic diagram of a portion of one embodiment of a memory array during one embodiment of a Forming operation.

FIG. 30 is a schematic depicting the performance of the process of FIG. 29. FIG. 30 shows three resistance elements 1100, 1102 and 1104, as described above. Resistance element 1102 is being formed to become the static resistance element (also referred to as emitter or dummy). Based on the voltages applied by the process of FIG. 29, a current is passed from the emitter Y line to the common X line, as indicated by arrow 1290.

FIG. 31 is a flow chart describing one embodiment of a process of performing a SET operation to set one of the multiple reversible resistance-switching elements of a multi-bit memory cell as described above. During the SET operation, the pn junction described above is reverse biased so that adjacent pn junctions operate like a bipolar transistor, as described above. That is, looking at FIG. 4, p+ layer 420, n-layer 410 and p+ layer 440 operate as a bipolar transistor.

In step 1300 of FIG. 31, unselected X lines are biased at 5.0 volts. In step 1302, the unselected Y line receives 4.7 volts. In step 1304, the selected X line is biased at 4 volts. In step 1306, the emitter line is biased at 5.5 volts. In some embodiments, multiple memory cells will be programmed at the same time so that multiple emitter lines will be biased in step 1306. In step 1308, the selected Y line is set at ground. If both reversible resistance-switching elements of a memory cell are to be SET, the process of FIG. 31 will be performed twice. FIG. 32A show schematics of a memory cell when a first reversible resistance-switching element of a memory cell is programmed. FIG. 32A shows the Y lines and selected X line at the biases described above with respect to FIG. 31. As a result of these voltages, a current (identified by arrow 1340) flows from the emitter Y line to Y line 1 via the static resistance element 1102 and the reversible resistance-switching element 1100, as per the bipolar transistor action described above.

FIG. 32B is a schematic diagram showing the multi-bit memory cell being programmed to SET the second reversible resistance-switching element 1104. There are two potential embodiments. In the first embodiment, current flows from Y line 1 to Y line 2 (via reversible resistance-switching elements 1100 and 1104), as identified by arrow 1342a. In another embodiment, current flows from the emitter Y line to Y line 2 (via static resistance element 1102 and reversible resistance-switching element 1104). In both cases, the bipolar transistor action described above takes place and the pn junction of the reversible resistance-switching element being SET is reverse biased.

Figure 33:
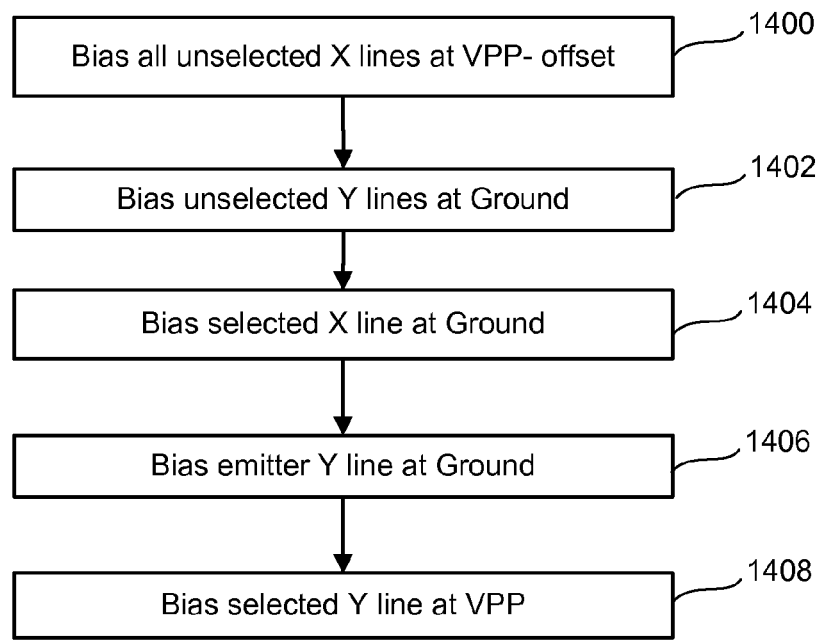
FIG. 33 is a flow chart describing one embodiment of a process for performing a RESET operation.

FIG. 33 is a flow chart describing one embodiment of a process for performing a RESET operation on the multi-bit memory cell described above. In step 1400, all unselected X lines are biased at Vpp-offset. In one example, the offset is Vt that is described above. In step 1402, the unselected Y lines are set to ground. In step 1404, the selected X line is set to ground. In step 1406, the emitter Y line is set to ground. In some embodiments, where there are more than one memory cell being programmed at the same time, multiple emitter Y lines can be set to ground. In step 1408, the selected Y line is set at Vpp.

Figure 34A:
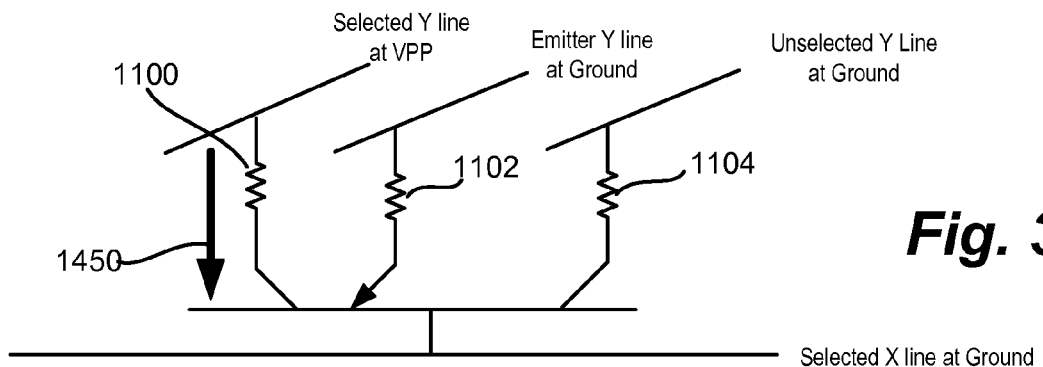
FIG. 34A is a schematic diagram of a portion of one embodiment of a memory array during one embodiment of a RESET operation.
Figure 34B:
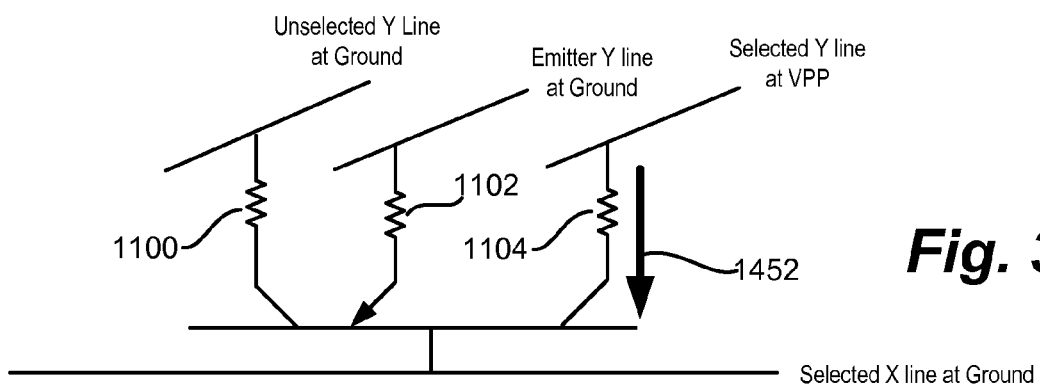
FIG. 34B is a schematic diagram of a portion of one embodiment of a memory array during one embodiment of a RESET operation.

FIGS. 34A and 34B are schematic diagrams depicting the performance of the process of FIG. 33. For multi-bit memory cells to have multiple collectors, each collector will be RESET separately. For example, FIG. 34 shows a first reversible resistance-switching element being RESET. FIG. 34B shows the second reversible resistance-switching element of a multi-bit memory cell being RESET. Both schematics show the various voltages being applied to the Y lines and selected X line. FIG. 34A shows a current identified by arrow 1450 passing from the selected Y line for the first reversible resistance-switching element 1100 to the selected X line. FIG. 34B shows a current represented by arrow 1452 passing from the selected Y line for reversible resistance-switching element 1104 to the selected X line. This current is used to RESET the reversible resistance-switching element.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A method of programming a first storage element of an integrated circuit memory system that includes the first storage element and a second storage element, the first storage element is connected between a first Y line and an X line, the second storage element is connected between a second Y line and the X line, the method comprising:
    passing a first current between the first Y line and the second Y line to cause the first storage element to change state to a first state, the first storage element and the second storage element share a common semiconductor region that runs along the X line and the passing of the first current between the first Y line and the second Y line includes passing the first current through the common semiconductor region.

2. The method of claim 1, wherein:
the passing of the first current between the first Y line and the second Y line includes passing the first current from the second Y line to the first Y line through the first storage element and the second storage element.

3. The method of claim 1, further comprising:
passing a second current between the first Y line and X line to cause the first storage element to change state from the first state to a second state.

4. The method of claim 3, further comprising:
passing a third current between the first Y line and X line; and
sensing resistance of the first storage element based on the third current.

5. The method of claim 3, wherein:
the first state is a high resistance state; and
the second state is a low resistance state.

6. The method of claim 1, wherein:
the first storage element includes a first semiconductor region adjacent a first portion of the common semiconductor region;
the second storage element includes a second semiconductor region adjacent a second portion of the common semiconductor region; and
the passing of the first current between the first Y line and the second Y line includes passing the first current through the common semiconductor region, the first semiconductor region and the second semiconductor region.

7. The method of claim 6, wherein:
the first semiconductor region is of a first type of semiconductor regions;
the second semiconductor region is of the first type of semiconductor regions;
the common semiconductor region is of a second type of semiconductor regions; and
the passing of the first current between the first Y line and the second Y line includes biasing the X line to cause the common semiconductor region, the first semiconductor region and the second semiconductor region to act like a transistor.

8. The method of claim 6, wherein:
the first semiconductor region is of a first type of semiconductor regions;
the second semiconductor region is of the first type of semiconductor regions;
the common semiconductor region is of a second type of semiconductor regions; and
the passing of the first current between the first Y line and the second Y line includes biasing the X line to cause the common semiconductor region, the first semiconductor region and the second semiconductor region to act like a transistor and regulate current from the second Y line to the first Y line in order to change the first storage element from a high resistance state to a low resistance state.

9. The method of claim 1, wherein:
the first storage element includes first reversible resistance-switching material;
the second storage element includes second reversible resistance-switching material;
the passing of the first current between the first Y line and the second Y line includes passing the first current through the first reversible resistance-switching material and the second reversible resistance-switching material to change state of the first reversible resistance-switching material to the first state.

10. The method of claim 1, wherein:
the first storage element and the second storage element are part of a three dimensional monolithic memory array;
the X line is a word line; and
the first Y line and the second Y line are bit lines that are perpendicular to the X line.

11. The method of claim 1, wherein:
the first storage element and the second storage element are non-volatile storage elements.

12. The method of claim 1, wherein:
the passing of the first current between the first Y line and the second Y line to cause the first storage element to change state to the first state does not cause the second storage element to change state.

13. A method of programming a first storage element of an integrated circuit memory system that includes the first storage element and a second storage element, the first storage element is connected between a first Y line and an X line, the second storage element is connected between a second Y line and the X line, the method comprising: passing a first current between the first Y line and the second Y line to cause the first storage element to change state to a first state, the passing of the first current between the first Y line and the second Y line to cause the first storage element to change state to the first state does not cause the second storage element to change state, and wherein the method further comprises passing a second current between the first Y line and X line to cause the first storage element to change state from the first state to a second state.

14. The method of claim 13, wherein:
the passing of the first current between the first Y line and the second Y line includes passing the first current from the second Y line to the first Y line through the first storage element and the second storage element.

15. The method of claim 13, further comprising:
passing a third current between the first Y line and X line; and
sensing resistance of the first storage element based on the third current.

16. The method of claim 13, wherein:
the first state is a high resistance state; and
the second state is a low resistance state.

17. The method of claim 13, wherein:
the first storage element and the second storage element share a common semiconductor region that runs along the X line and is in communication with the X line;
the first storage element includes a first semiconductor region adjacent a first portion of the common semiconductor region;
the second storage element includes a second semiconductor region adjacent a second portion of the common semiconductor region; and
the passing of the first current between the first Y line and the second Y line includes passing the first current through the common semiconductor region, the first semiconductor region and the second semiconductor region.

18. The method of claim 17, wherein:
the first semiconductor region is of a first type of semiconductor regions;
the second semiconductor region is of the first type of semiconductor regions;
the common semiconductor region is of a second type of semiconductor regions; and
the passing of the first current between the first Y line and the second Y line includes biasing the X line to cause the common semiconductor region, the first semiconductor region and the second semiconductor region to act like a transistor.

19. The method of claim 13, wherein:
the first storage element includes first reversible resistance-switching material;
the second storage element includes second reversible resistance-switching material;
the passing of the first current between the first Y line and the second Y line includes passing the first current through the first reversible resistance-switching material and the second reversible resistance-switching material to change state of the first reversible resistance-switching material to the first state.

20. The method of claim 13, wherein:
the first storage element and the second storage element are part of a three dimensional monolithic memory array;
the X line is a word line; and
the first Y line and the second Y line are bit lines that are perpendicular to the X line.

21. The method of claim 13, wherein:
the first storage element and the second storage element are non-volatile storage elements.

22. A method of programming a first storage element of a memory system that includes the first storage element and a second storage element, the first storage element is connected between a first Y line and an X line, the second storage element is connected between a second Y line and the X line, the first storage element and the second storage element share a common semiconductor region that runs along the X line, the first storage element includes a first semiconductor region adjacent a first portion of the common semiconductor region, the second storage element includes a second semiconductor region adjacent a second portion of the common semiconductor region, the method comprising:
biasing the X line to allow current between the second semiconductor region and the first semiconductor region through the common semiconductor region;
biasing the first Y line to a low voltage level; and
biasing the second Y line to a higher voltage level to cause a current from the second Y line to the first Y line through the second semiconductor region, the common semiconductor region and the first semiconductor region to cause the first storage element to change state to a first state.

23. The method of claim 22, further comprising:
biasing the X line to deter current between the second semiconductor region and the first semiconductor region through the common semiconductor region; and
biasing the first Y line to a high voltage level to cause a current from the first Y line to the X line to cause the first storage element to change state from the first state to the second state.

24. The method of claim 22, wherein:
the first storage element includes first reversible resistance-switching material;
the second storage element includes second reversible resistance-switching material;
the biasing the second Y line to the higher voltage level cause the current from the second Y line to the first Y line to pass through the first reversible resistance-switching material and the second reversible resistance-switching material and causes the first reversible resistance-switching material to change state to the first state.

25. A method of programming a first storage element of a memory system that includes the first storage element and a second storage element, the memory system also includes additional storage elements, the first storage element is connected to a selected control line of the first type of control lines and a selected control line of a second type of control lines, the second storage element is connected to the selected control line of the first type of control lines and a different control line of the second type of control lines, the first storage element and the second storage element share a common semiconductor region, the additional storage elements are connected to unselected control lines of the first type of control lines and unselected control lines of the second type of control lines, the method comprising:
biasing unselected control lines of the first type of control lines to a first voltage level;
biasing the selected control line of the first type of control lines to a second voltage level, the second voltage level is lower than the first voltage level;
biasing unselected control lines of the second type of control lines to a third voltage level, the third voltage level is lower than the first voltage level;
biasing the selected control line of the second type of control lines to a fourth voltage level, the fourth voltage level is lower than the second voltage level; and
biasing the different control line of the second type of control lines to a fifth voltage level, the fifth voltage level is higher than the fourth voltage level, current from the different control line changes state of the first storage element to a first state.

26. The method of claim 25, further comprising:
biasing unselected control lines of the first type of control lines to a sixth voltage level;
biasing the selected control line of the first type of control lines to a seventh voltage level, the seventh voltage level is lower than the sixth voltage level;
biasing unselected control lines of the second type of control lines to an eighth voltage level, the eighth voltage level is lower than the sixth voltage level; and
biasing the selected control line of the second type of control lines to a ninth voltage level, the ninth voltage level is higher than the seventh voltage level and the eighth voltage level, current from the selected control line of the second type of control lines changes state of the first storage element from the first state to a second state.

27. The method of claim 25, wherein:
the biasing of the different control line of the second type to the fifth voltage level does not change state of the second storage element.

* * * * *